(12) United States Patent
Ohkura et al.

(10) Patent No.: US 6,763,839 B2
(45) Date of Patent: Jul. 20, 2004

(54) SUBSTRATE CLEANING SYSTEM

(75) Inventors: Ryoichi Ohkura, Hachioji (JP); Yuji Ono, Ota-ku (JP); Hiroshi Yamaguchi, Kunitachi (JP); Miyuki Takaishi, Tokorozawa (JP); Hideo Kamikochi, Hachioji (JP)

(73) Assignee: S.E.S. Company Limited, Tokyo (JP)

( * ) Notice: Subject to any disclaimer, the term of this patent is extended or adjusted under 35 U.S.C. 154(b) by 148 days.

(21) Appl. No.: 09/871,250

(22) Filed: Jun. 1, 2001

(65) Prior Publication Data

US 2002/0179127 A1 Dec. 5, 2002

(51) Int. Cl.$^7$ ................................................ B08B 3/00
(52) U.S. Cl. ........................ 134/66; 134/61; 134/200; 134/902
(58) Field of Search ........................... 134/61, 66, 78, 134/200, 902

(56) References Cited

U.S. PATENT DOCUMENTS

| | | | | |
|---|---|---|---|---|
| 5,518,542 A | * | 5/1996 | Matsukawa et al. | 118/52 |
| 5,829,939 A | * | 11/1998 | Iwai et al. | 414/411 |
| 5,975,097 A | * | 11/1999 | Yonemizu et al. | 134/95.2 |
| 2001/0010950 A1 | * | 8/2001 | Savage et al. | 438/124 |

FOREIGN PATENT DOCUMENTS

EP          0982098 A2 *   3/2000

* cited by examiner

Primary Examiner—Frankie L. Stinson
Assistant Examiner—Joseph L. Perrin
(74) Attorney, Agent, or Firm—Armstrong, Kratz, Quintos, Hanson & Brooks, LLP

(57) ABSTRACT

A substrate cleaning system for cleaning wafers using a sheet-type wet cleaning treatment. The system has a sealable system body, a loading/unloading booth having a substrate carry-in section in which a plurality of substances are stocked to be carried in before a cleaning treatment is applied to them and a substrate carry-out section in which a plurality of substrates are stocked to be carried out after the cleaning treatment is applied, a processing booth provided with at least one sheet-type substrate cleaning chamber in which the cleaning treatment can be applied to a plurality of substrates by a plurality of cleaning solutions, and a robot booth provided with a transport robot for transporting the substrates one by one between the processing booth and the loading/unloading booth, the respective booths having partition walls.

5 Claims, 24 Drawing Sheets

SUBSTRATE CLEANING SYSTEM

BACKGROUND OF THE INVENTION

1. Field of the Invention

The invention relates to a substrate cleaning system, particularly to a wet cleaning treatment technique for applying to a semiconductor wafer and the like a wet cleaning treatment which is carried out in a pre-step process of a thin film forming process by a spattering, a CVD process and the like in a device fabricating process of a semiconductor, electronic devices and the like.

2. Related Art

For a method of applying a wet cleaning treatment to a semiconductor wafer and the like (hereinafter referred to simply as a wafer), a batch processing wet cleaning treatment has been conventionally a mainstream in which a plurality of wafers accommodated in a carrier cassette or a plurality of wafers without being accommodated in a carrier cassette are subsequently immersed by a transport unit and processed in a wet batch type cleaning solution bath comprised of a plurality of consecutively aligned cleaning solution baths. However, entering upon a sub-micron application age of recent semiconductor devices, a very high cleanliness required on its surface as the construction of such a semiconductor device is micro-fabricated and highly integrated. To satisfy the foregoing high cleanliness, a so called sheet-type wet cleaning treatment is developed and proposed wherein wet cleaning treatment is applied to a plurality of wafers one by one in a sealed cleaning room without being accommodated in a cassette.

In the sheet-type wet cleaning treatment, the wafers can be cleaned with a high precision in a high cleanliness atmosphere while particles are not re-stuck to the wafers, and hence this cleaning is simple and compact in construction and has an advantage that it can effectively cope with a large item small scale production.

Since cleaning equipment per se is installed in a clean room while it is kept in a high cleanliness at an atmosphere in both the conventional batch processing wet cleaning treatment and sheet-type wet cleaning treatment, an equipment body is opened in its floor section and wafer carry-in and carry-out sections thereof while booths in the equipment body are respectively opened so as to take precedence of workability.

However, with the construction of the conventional cleaning equipment, it is impossible to completely prevent particles from being re-stuck onto wafers after cleaning treatment, splash of cleaning solution and the like involved in applying a cleaning treatment to wafers, and adverse effects upon an operator caused by generations of dust from the wafers per se. Further, it is necessary to apply a corrosion resistance coating to an entire wall surface of the equipment body, leading to a problem of high fabricating cost.

SUMMARY OF THE INVENTION

The invention has been made in view of the problems of the foregoing cleaning equipment, and it is an object of the invention to provide a substrate cleaning system which is capable of cleaning wafers in a high cleanliness atmosphere with high accuracy taking advantage of the sheet-type wet cleaning treatment for applying a cleaning treatment to the wafers one by one in a sealed cleaning chamber without being accommodated in a cassette, and which is simple and compact in construction, and is excellent in cost performance.

To achieve the above object, the substrate cleaning system of the invention comprises a system body 1 capable of being sealed, a loading/unloading booth A comprising a substrate carry-in section Aa in which a plurality of wafers W are stocked on standby to be carried in before they are processed and a substrate carry-out section Ab in which a plurality of wafers W are stocked on standby to be carried out after they are processed, a processing booth C provided with at least one sheet-type substrate cleaning chamber 10 in which a plurality of wafers are cleaned by a plurality of cleaning solutions, and a robot booth B sandwiched between the processing booth C and the loading/unloading booth A and provided with a transport robot for transporting the wafers one by one, wherein the respective booths are partitioned by partition walls each having a required minimum cross sectional area.

In a preferred embodiment, the loading/unloading booth A and the robot booth B are respectively installed back and forth at both sides of the system body 1, the robot booth B is sandwiched between the loading/unloading booth A and the processing booth C, the loading/unloading booth A has openings 11, 12 which are openable to an operating space provided outside the system body.

With the loading/unloading booth A, the wafers to be stocked in the carry-in section Aa and carry-out section Ab are aligned horizontally with a given alignment pitch in a vertical direction, and clean air flowing inside the loading/unloading booth A is directed from the carry-in section Aa to the carry-out section Ab.

The transport robots 70 in the robot booth B are formed of a twin arm robot each provided with a pair of hand sections 70a, 70b movable vertically and horizontally, and one of the hand sections transports the wafers to which a cleaning treatment is not applied yet (hereinafter referred to as "wafer before cleaning treatment") while the other hand section transports the wafers to which a cleaning treatment was applied (hereinafter referred to as "wafer after cleaning treatment".

The corrosion resistance coating treatment is applied to the inner wall surface of the processing booth C a with vinyl chloride resin and oxidation resistance painting treatment is applied to the other wall side of the processing booth C. Further, the sheet-type substrate cleaning chamber 10 in the processing booth C is provided with a plurality of circular processing baths 85 to 88 which are aligned vertically, and comprises a chamber body 80 which moves vertically, and a substrate rotating unit 81 which is disposed concentrically with the chamber body 80 at the center and rotates a piece of wafer horizontally while supporting it horizontally, and wherein the wafers supported by the substrate rotating unit 81 and the circular processing baths 85 to 88 are positioned when the chamber body 80 moves up and down vertically. Further, the chamber body 80 is a sealed container provided with an openable substrate carry-in gate 90.

According to the invention, since the loading/unloading booth A, processing booth C and robot booth B are respectively installed in the system body which can be sealed, and the respective booths are partitioned by partition walls each having a required minimum sectional area, incoming and outgoing of air between the system body and the outside are restrained to a required minimum extent, so that the interior of the system body can be maintained in a high cleanliness atmosphere.

Since the system is of a sheet-type wet cleaning treatment for applying a cleaning treatment to wafers one by one, particles and the like are scarcely re-stuck to the wafers so that wafers can be processed with a high precision, and a cleaning space in the substrate cleaning chamber is rendered small and a quantity of cleaning solution is rendered small.

Since the system also employs a one chamber type for applying a cleaning treatment to the wafers one by one by a plurality of cleaning solutions, namely, all the cleaning treatments can be effected in one substrate cleaning chamber, the wafers are not carried in or out of the chamber in the cleaning steps so that the wafers do not contact an outside atmosphere, and hence they are not susceptible to a metallic contamination or influence of ion and oxygen and the like, and the construction of each substrate cleaning chamber can be simplified and small sized.

Since the loading/unloading booth A and the robot booth B are respectively installed back and forth at both sides of the system body 1, and the robot booth B is sandwiched between the loading/unloading booth A and the processing booth C, harmful gas or particles generated when cleaning treatment is effected in the processing booth are not leaked into an operating space outside the system body.

Further, since the wafers stocked in the carry-in section Aa and carry-out section Ab are aligned vertically in a horizontal state at a given alignment pitch, clean air flowing in the loading/unloading booth A is directed horizontally from the carry-out section Ab to carry-in section Aa and the transport robots 70 in the robot booth B are formed of a twin arm robot each provided with a pair of hand sections 70a, 70b wherein one of the hand sections transports the wafer before cleaning treatment while the other hand section transports the substrate after cleaning treatment, it is possible to effectively prevent particles and the like from being re-stuck to the wafers after cleaning treatment from the wafer before cleaning treatment.

PREFERRED EMBODIMENT OF THE INVENTION

Figure 1:
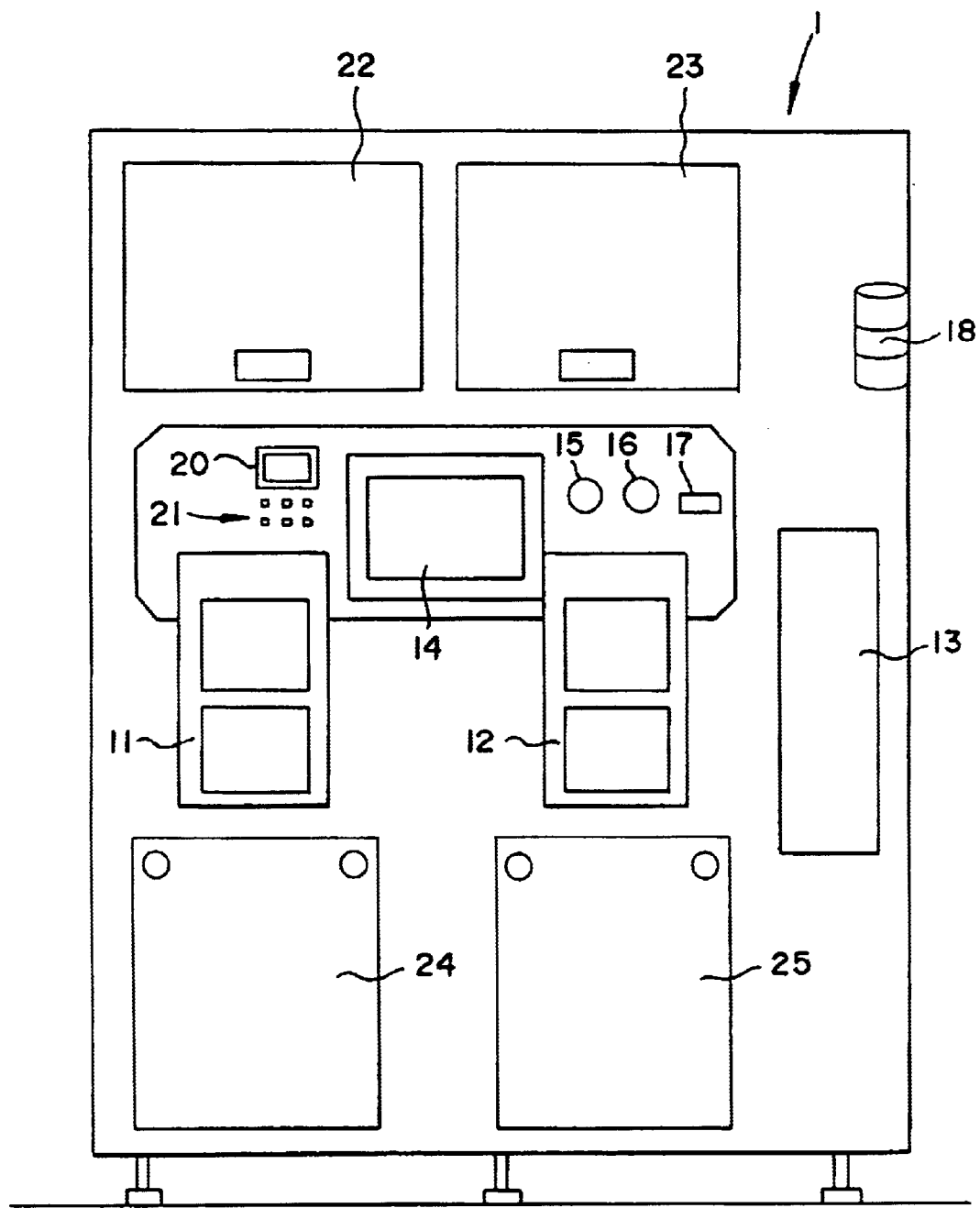
FIG. 1 is a frontview showing an external appearance of a substrate cleaning system according to a preferred embodiment of the invention.

A substrate cleaning system according to a preferred embodiment of the invention is now described in detail with reference to the attached drawings.

The substrate cleaning system according to the invention is shown in FIGS. 1 to 22. The substrate cleaning system is constituted by a sheet-type substrate cleaning chamber by a basic unit for applying a cleaning treatment to wafers W one by one and is installed in a clean room which is in a clean atmosphere.

The substrate cleaning system has a loading/unloading booth A, a robot booth B and a processing booth C respectively installed inside a system body 1 which can be sealed, and the loading/unloading booth A, robot booth B, and processing booth C are partitioned by partition walls 2, 3.

In the preferred embodiment, the loading/unloading booth A and processing booth C are installed back and forth at both sides of the system body 1, and the robot booth B is interposed or sandwiched between the loading/unloading booth A and processing booth C while sealable openings 11, 12 are provided at the front side of the loading/unloading booth A which are openable to an operating space O outside the system body 1. A plurality of (two in FIG. 7) substrate cleaning chambers 10, 10 are disposed in the processing booth C, namely, a so called two chamber system is disposed in the processing booth C.

Each substrate cleaning chamber 10 is connected to a cleaning solution supply unit D serving as a cleaning solution supply source, and the respective booths and units A to D are mutually interlocked with one another by a system control unit E and are driven thereby. Each construction of these booths and units are sequentially described hereinafter.

I. System body 1

The system body 1 has a construction which can be sealed relative to an external clean room so as to maintain and enhance cleanliness.

Oxidation resistance painting treatment is applied to the surface of a steel plate of an external wall of the system body 1 while a coating treatment is applied only to the circumference of the steel plate of the inner wall surface of the processing booth C with a corrosion resistance material, more in detail, a coating treatment is applied with a vinyl chloride resin (PVC), thereby securing corrosion resistance relative to a cleaning solution. The reason why corrosion resistance treatment is applied only to the inner wall surface of the processing booth C is that respective booths A, B, and C in the system body 1 form spaces which are partitioned by the partition walls 2, 3 and isolated from one another as far as possible. With the employment of such a wall construction, it is possible to reduce manufacturing cost of a frame of the system, and also to reduce time to undertake the construction.

As shown in FIG. 1, a loader opening, i.e., the openings 11 and unloader opening, i.e., openings 12 are respectively provided at the front wall surface of the system body 1, wherein the openings 11, 12 have sectional areas through which carriers storing therein wafers W, W . . . , described later, can be inserted in two stages, i.e., upper and lower stages. Both the openings 11, 12 have an automatic shutter mechanism formed of a see-through cover-through which the inside thereof can be seen, and they can be slid vertically so as to form a sealed construction which is automatically opened or closed. As a result, it is possible to prevent particles and the like from entering from a clean room to the loading/unloading booth A, Depicted by 13 is a HEPA filter through which clean air is introduced into the loading/unloading booth A. Depicted by 14 is a display serving also as a touch panel through which an operation system of a system program by way of recipes and parameters is set. There are provided an emergency stop button (red) 15 and a temporary stop button (green) 16 at the right side of the display 14, and hand pendant connector 17 and patrite 18 to be connected on an operation board are provided at the right side of the temporary stop button 16. An alarm buzzer 20 is provided at the left side of the display 14 and ON/OFF switches 21 are provided under the alarm buzzer 20 for actuating or stopping various units. Closing doors 22, 23 each provided with a lock mechanism for locking an electric system of the units and a variety of electric components such as sequencers and the like are provided over the display 14 in parallel with each other. Maintenance openings 24, 25 for use in various driving mechanism of the loading/unloading booth A are provided under the front wall surface so as to be opened and closed.

Figure 2:
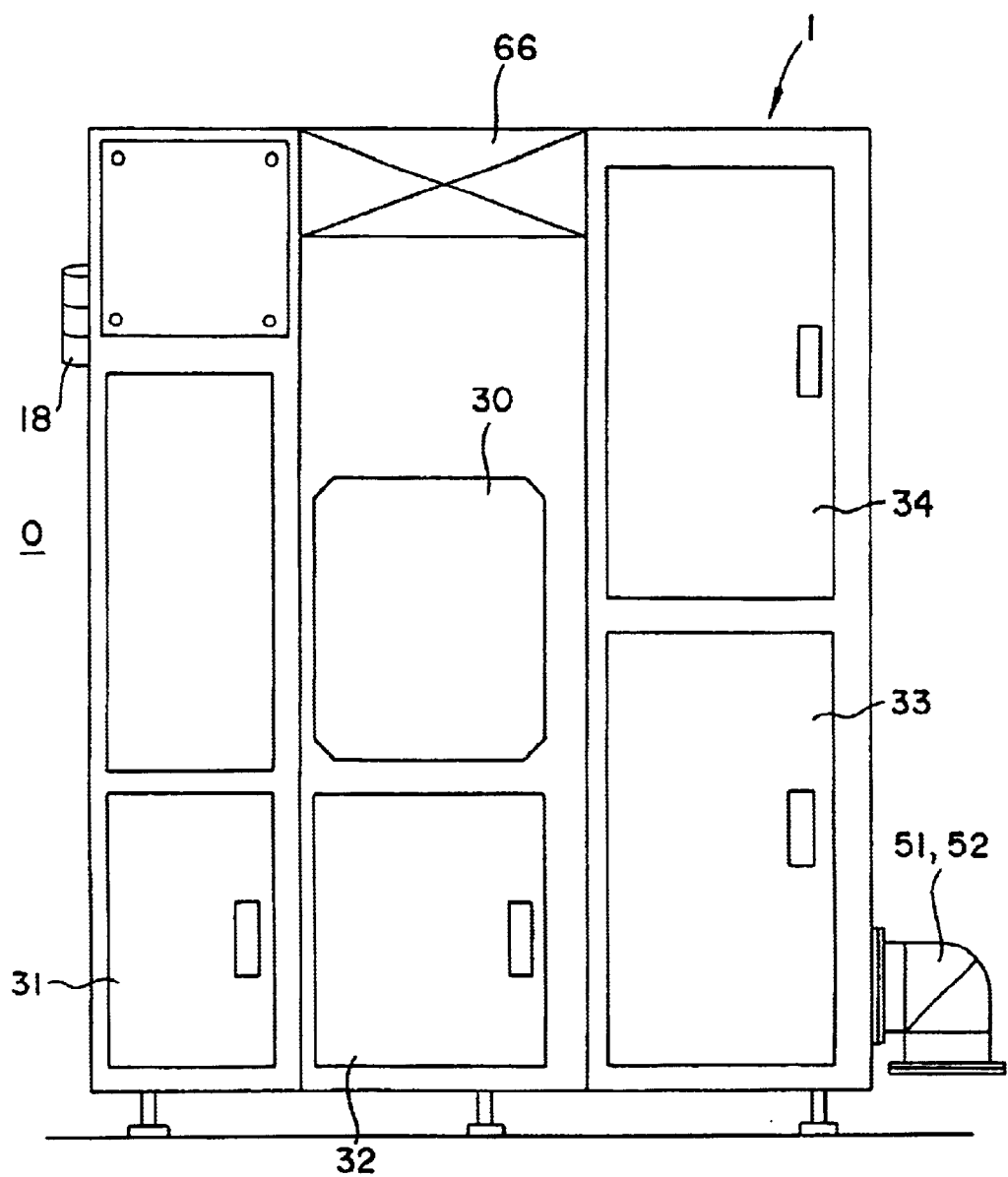
FIG. 2 is a right side view showing the external appearance of the substrate cleaning system.

An opening 30 for a transport system is provided on the right side wall surface of the system body 1 at the center thereof as shown in FIG. 2, wherein the opening 30 is provided with an automatic shutter mechanism formed of a see-through cover through which the inside of the opening 30 can be seen, and formed of a sealed construction which can be automatically opened or closed. Further, various maintenance openings 31 to 34 are provided at the circumference of the opening 30 so as to be opened and closed.

Figure 3:
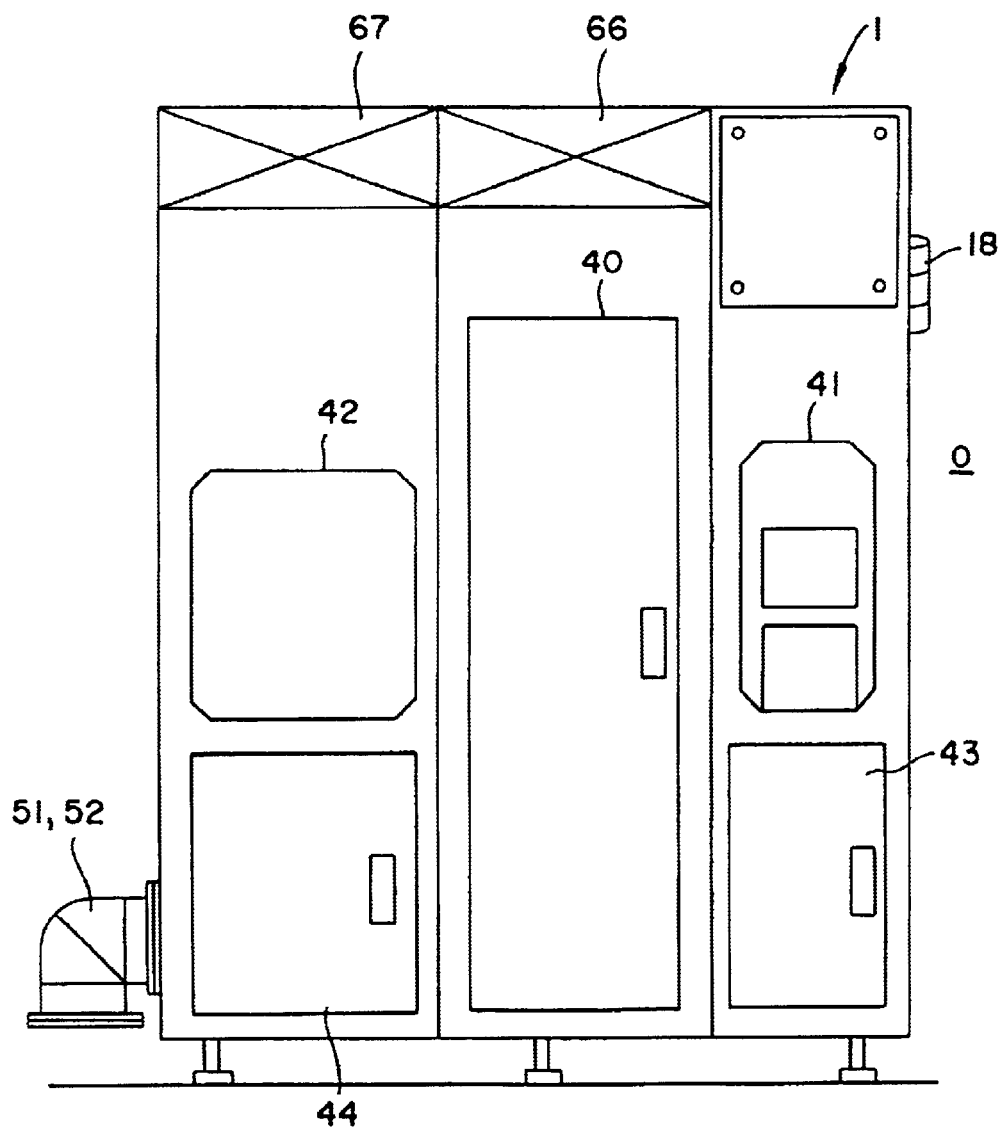
FIG. 3 is a left side view showing the external appearance of the substrate cleaning system.

A robot maintenance opening 40 is provided on the left wall surface of the system body 1 at the center thereof for the robot booth B as shown in FIG. 3, and the opening 40 has a sectional area through which an operator can enter. The opening 40 can be opened or closed by a door provided with a key switch, and precautions have been taken such that when the key is inserted into the opening 40, the door is released so that the energization of the system is turned off (pause state). A visible window 41 for seeing the inside of the loading/unloading booth A and a visible window 42 for seeing the inside of the processing booth C are respectively provided at both sides of the opening 40, and maintenance openings 43, 44 are provided under the opening 40.

Figure 4:
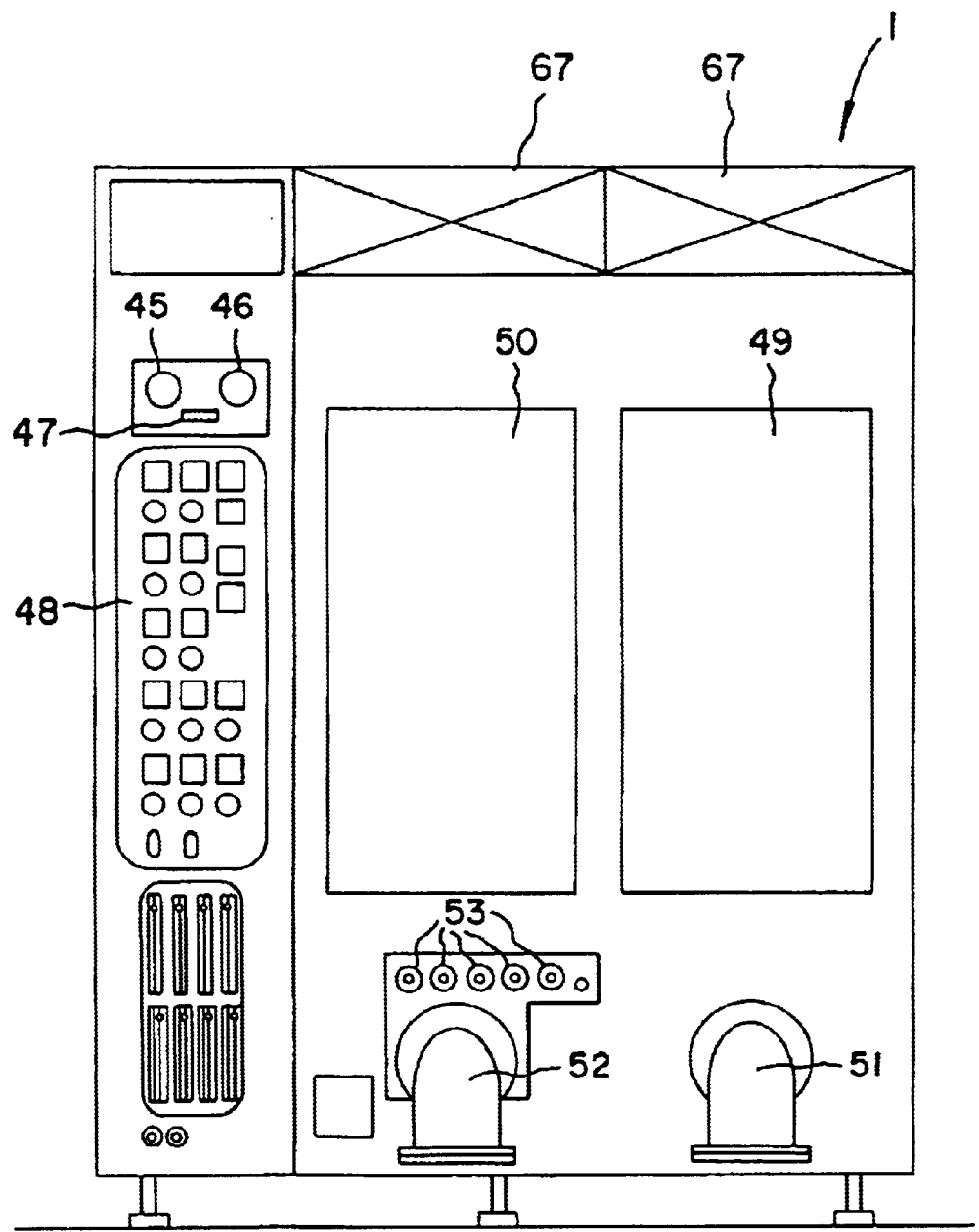
FIG. 4 is a rear view showing the external appearance of the substrate cleaning system.

An emergency stop button 45, a pause (temporally stop) button 46 and hand pendant connector 47 are respectively provided on a rear side wall surface of the system body 1 as shown in FIG. 4, while an indicator showing an $N_2$ pressure or air pressure at a use point for operating the substrate cleaning chamber 10 and a panel 48 provided with a regulator and the like are disposed thereunder. Depicted by 49 and 50 are maintenance openings for the substrate cleaning chamber 10 of the processing booth C, wherein the openings 49, 50 have a double seal structure for effectively preventing passage of the liquid of cleaning solution and the like to the outside of the system body 1. Depicted by 51, 52 are air discharge openings for discharging air inside the system body 1, and 53, 53 . . . are connector pores for connecting to various pipes.

II. Loading/unloading Booth A

The loading/unloading booth A comprises the carry-in section Aa and carry-out section Ab.

The carry-in section Aa is a section in which the wafers W are carried from a pre-step, and a plurality of wafers W, W . . . before cleaning treatment, are stocked in the carry-in section Aa so as to be rendered standby to be carried therein. The carry-out section Ab is a section from which the wafers W are carried out to a next step, and a plurality of processed wafers W, W . . . are stocked in the carry-out section Ab so as to be rendered standby to be carried out therefrom. These sections Aa, Ab have the same basic constructions described hereinafter.

Figure 5:
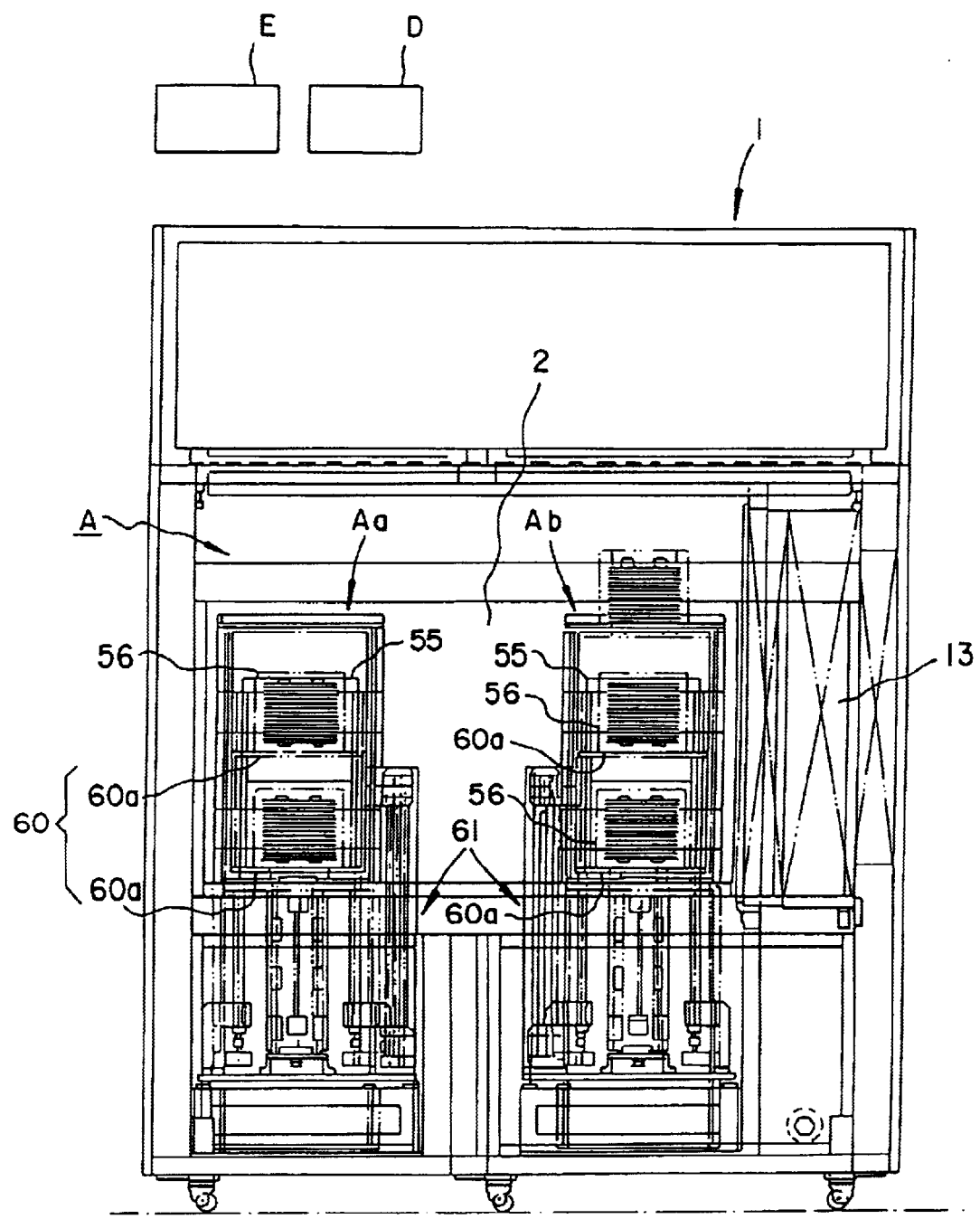
FIG. 5 is a front view showing an internal construction of a loading/unloading booth A of the substrate cleaning system.
Figure 6:
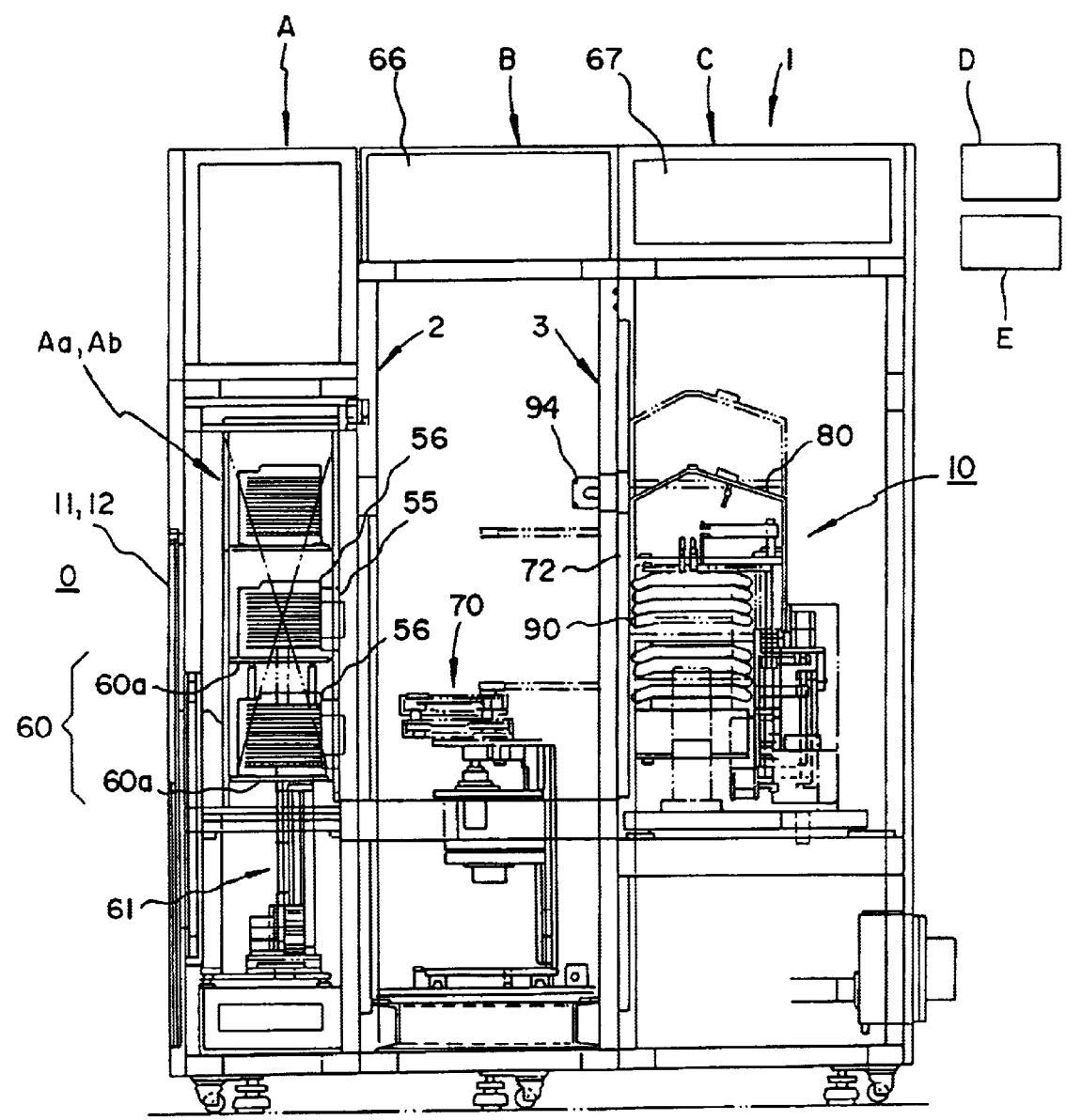
FIG. 6 is a side sectional view showing the internal construction of the loading/unloading booth A of the substrate cleaning system.
Figure 7:
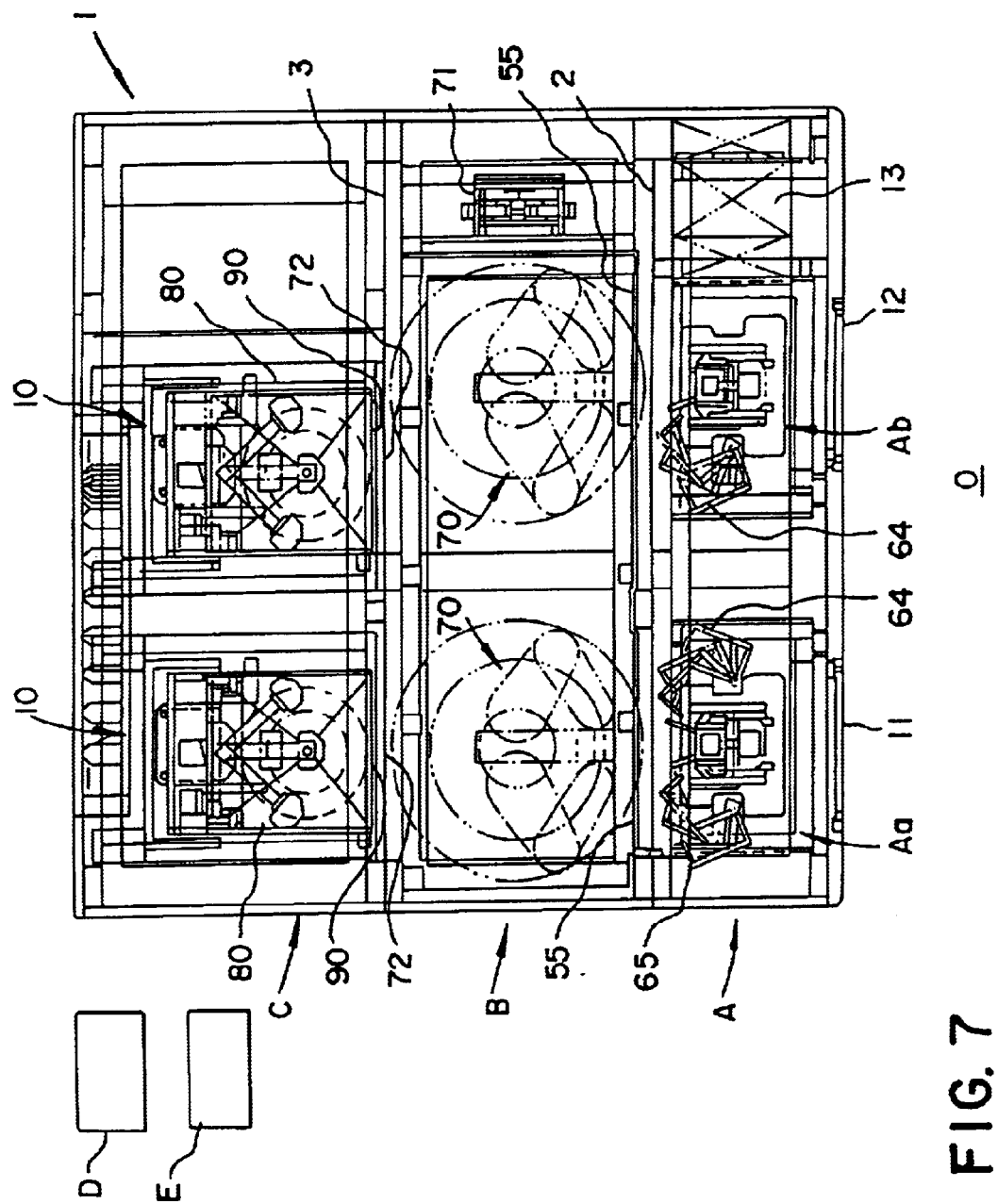
FIG. 7 is a plan sectional view showing the internal construction of the loading/unloading booth A of the substrate cleaning system.

That is, exemplifying the carry-in section Aa, the carry-in section Aa can be opened or closed relative to the operating space 0 through the opening 11 formed in the front side wall surface of the system body 1 as shown in FIGS. 5 to 7, and it communicates with the robot booth B through the opening 55 of the partition wall 2. A sectional area of the opening 55 is set to a required minimum size, namely, to a size through which hands of a transport robot 70, described later, pass while holding each wafer W.

The carry-in section Aa comprises a substrate holding section 60 for holding each carrier 56 which stores a plurality of wafers W, W, . . . at a given pitch in a vertical direction in a horizontal state, and an elevation positioning unit 61 for positioning the wafers W, W, . . . stored in the carrier 56 so as to carry the wafers W, W, . . . in or out of the carrier 56 while moving the substrate holding section 60 in the vertical direction.

Figure 8:
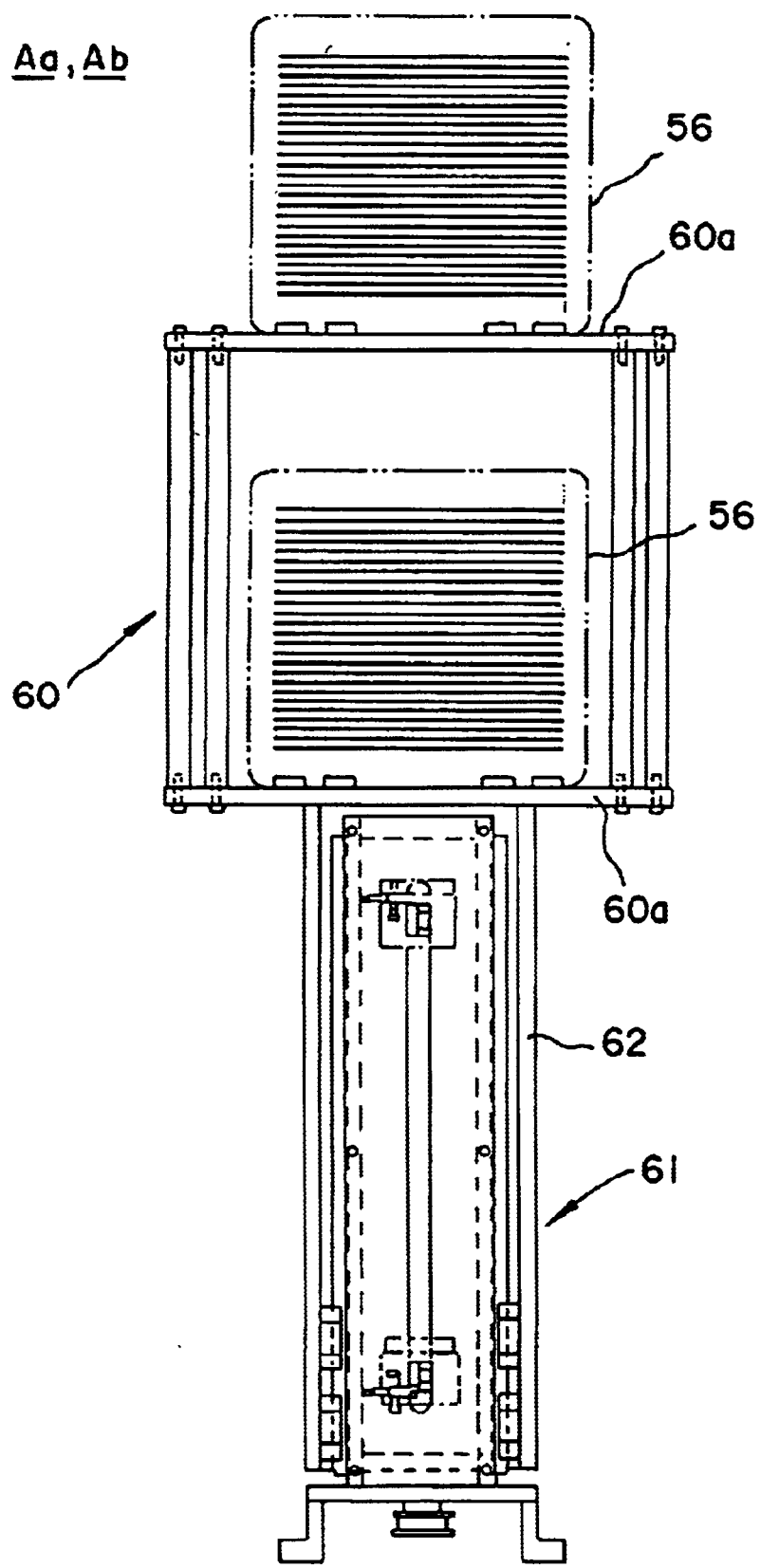
FIG. 8 is a front view showing a substrate holding section and an elevation unit in the loading/unloading booth A of the substrate cleaning system.
Figure 9:
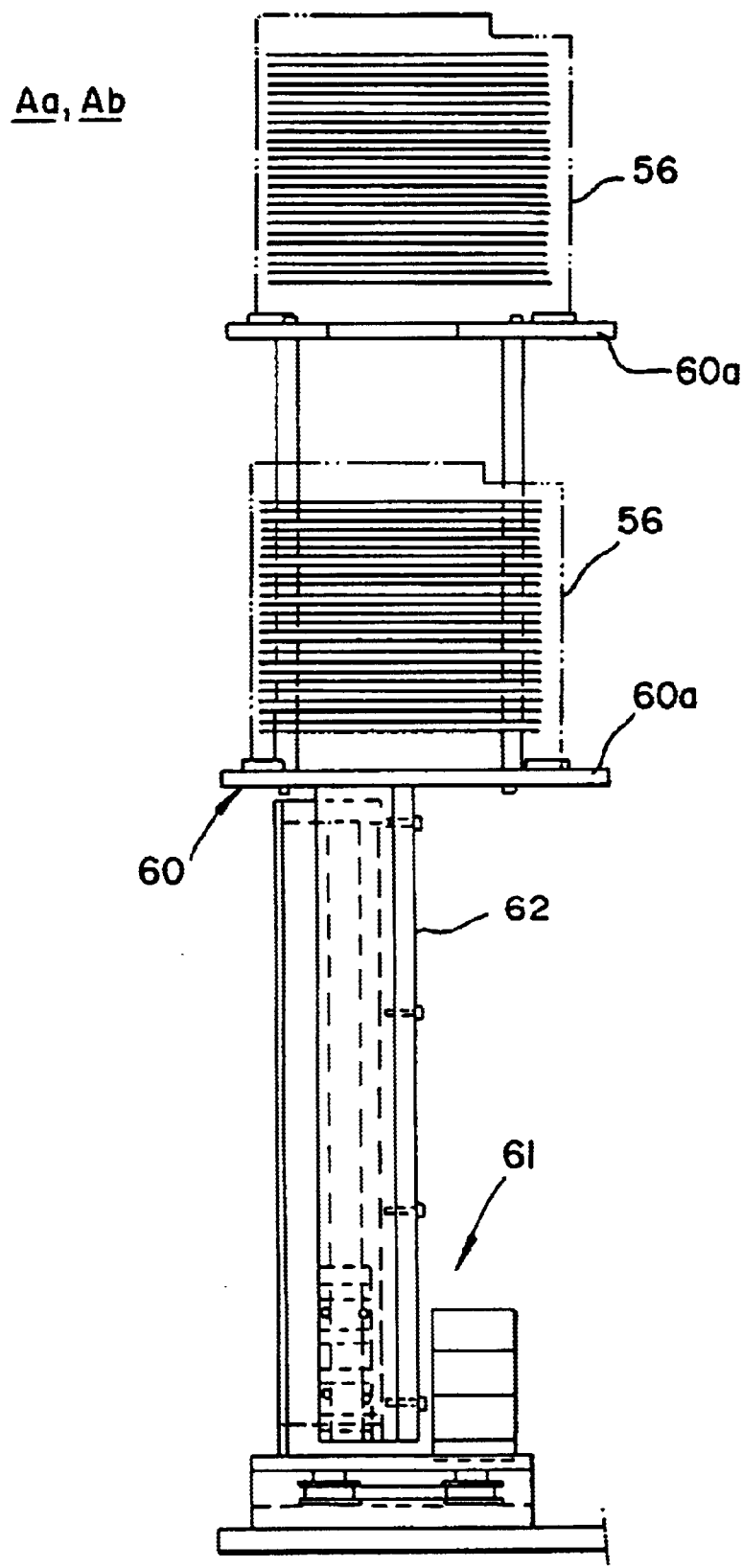
FIG. 9 is a side view showing the substrate holding section and the elevation unit in the loading/unloading booth A of the substrate cleaning system.
Figure 10:
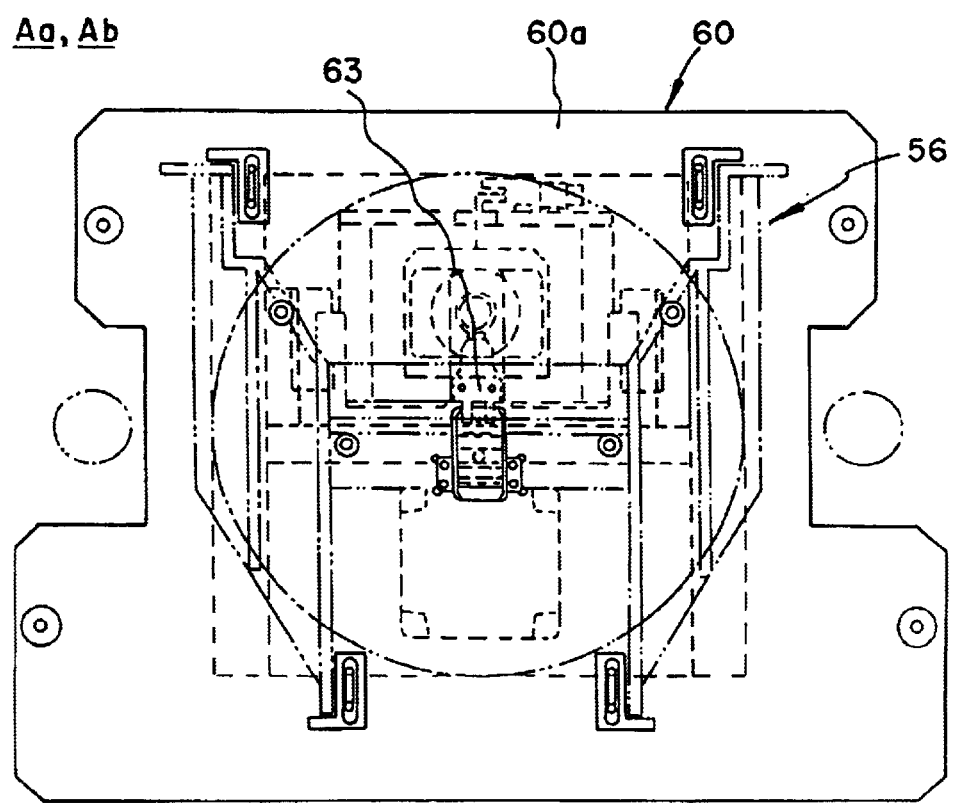
FIG. 10 is a plan view showing the substrate holding section and the elevation unit in the loading/unloading booth A of the substrate cleaning system.
Figure 11:
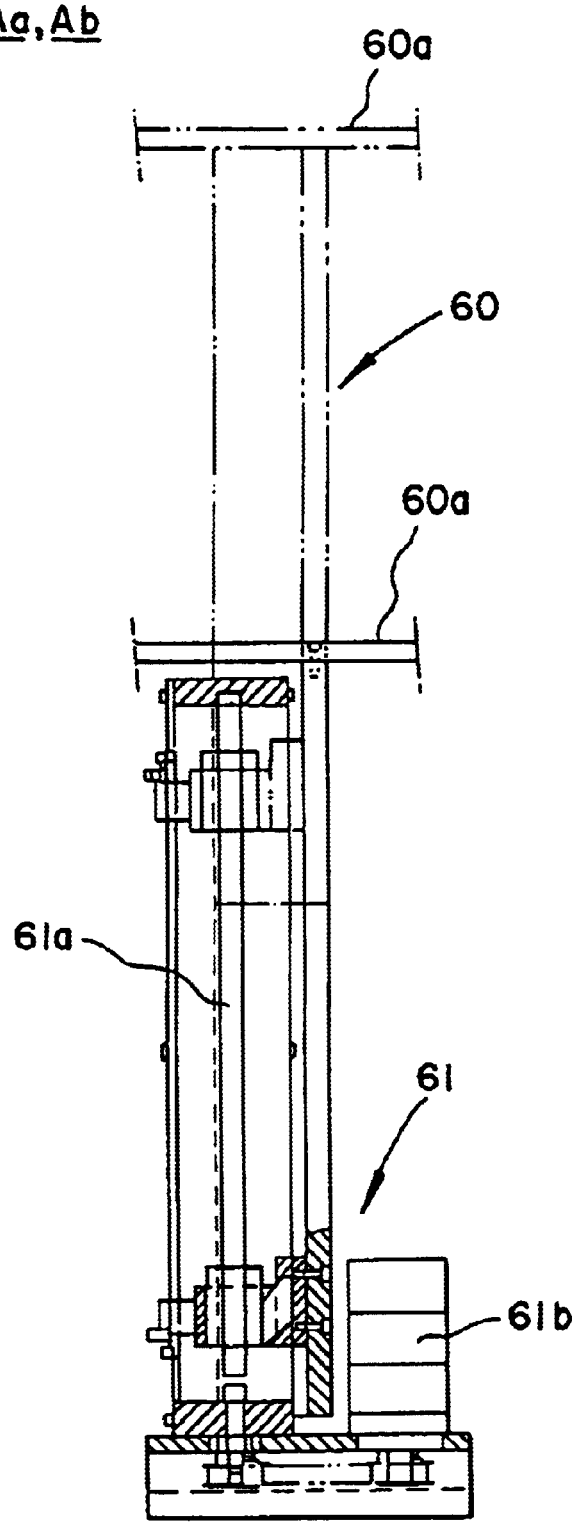
FIG. 11 is a side view of the elevation unit a part of which is cut.

As shown in FIGS. 8 to 10, the substrate holding section 60 is provided with holding tables 60a, 60a each having a horizontal placing surface for placing and holding each carrier 56 thereon in which a plurality of wafers W, W, . . . (26 pieces in these figures) are stored. In the embodiment shown in these figures, two holding tables 60a, 60a are disposed on a supporting frame 62 at a given interval in a vertical direction. The opening 11 has a sectional area through which two carriers 56 can be inserted and placed on the two stage holding tables 60a, 60a at the same time.

Each carrier 56 also serves for transporting wafers outside the system, and has holding groves at a given alignment pitch for holding the peripheral edge of each wafer W. When each carrier 56 transports the wafers W, W, . . . , the wafers W, W, . . . are held in a vertically upright posture while when the wafers W, W, . . . are placed on the holding tables 60a, 60a, the wafers W, W, . . . are held horizontally face down.

The elevation positioning unit 61 is formed of a carrier elevation mechanism comprising, as shown in FIGS. 8 to 11, lead screw mechanism 61a for moving the supporting frame 62 up and down and a driving motor 61b for rotatably driving the lead screw mechanism 61a. The holding tables 60a, 60a, and further the wafers W, W, . . . stored in the carriers 56,56 are moved up and down by a given pitch in a vertical direction via the lead screw mechanism 61a when the driving motor 61b which interlocks with the operation of a transport robot 70 is driven, described later, thereby effecting positioning the wafers W, W, . . . to be carried in or out from the carriers 56, 56.

In association with the foregoing construction, a carrier inclination detection sensor 63, a wafer jumping alignment mechanism 64 and a wafer mapping sensor 65 are provided.

The carrier inclination detection sensor 63 detects whether each carrier 56 is disposed correctly on the holding tables 60a, 60a, and, in the figures, it is a transmission optical sensor for detecting whether each carrier 56 is placed correct horizontally on the holding tables 60a, 60a. When each carrier 56 is placed aslant on the holding tables 60a, 60a, the carrier inclination detection sensor 63 cannot detect each carrier 56, and serves as a security mechanism for stopping the driving of the system.

The wafer jumping alignment mechanism 64 is provided to allow the transport robot 70 to take out each wafer W smoothly with assurance, and has a horizontally swingable swing arm 64a, a contact 64b which contacts edges of the wafers W, W, . . . to press them, and a driving motor 64c for swinging the swing arm 64a.

When the driving motor 64c is driven, the swing arm 64a of the wafer jumping alignment mechanism 64 is horizontally swung relative to the carriers 56, 56 placed on the holding tables 60a, 60a so that the contact 64b contacts the edges of the wafers W, W, . . . in the carriers 56, 56. As a result, wafer jumping alignment mechanism 64 presses the edges of the wafers W, W, . . . so as to align and position the wafers W, W, . . . at a given position. The wafer jumping alignment mechanism 64 operates every up-and-down movement of the carriers 56, 56 by the elevation positioning unit 61 every given pitch, thereby always assuring the alignment and positioning of the wafers W, W, . . . at a given position.

It may be possible to provide an optical sensor for detecting the jumping of each wafer W, and the wafer jumping alignment mechanism 64 may operate only when each wafer W is jumped.

Figure 12:
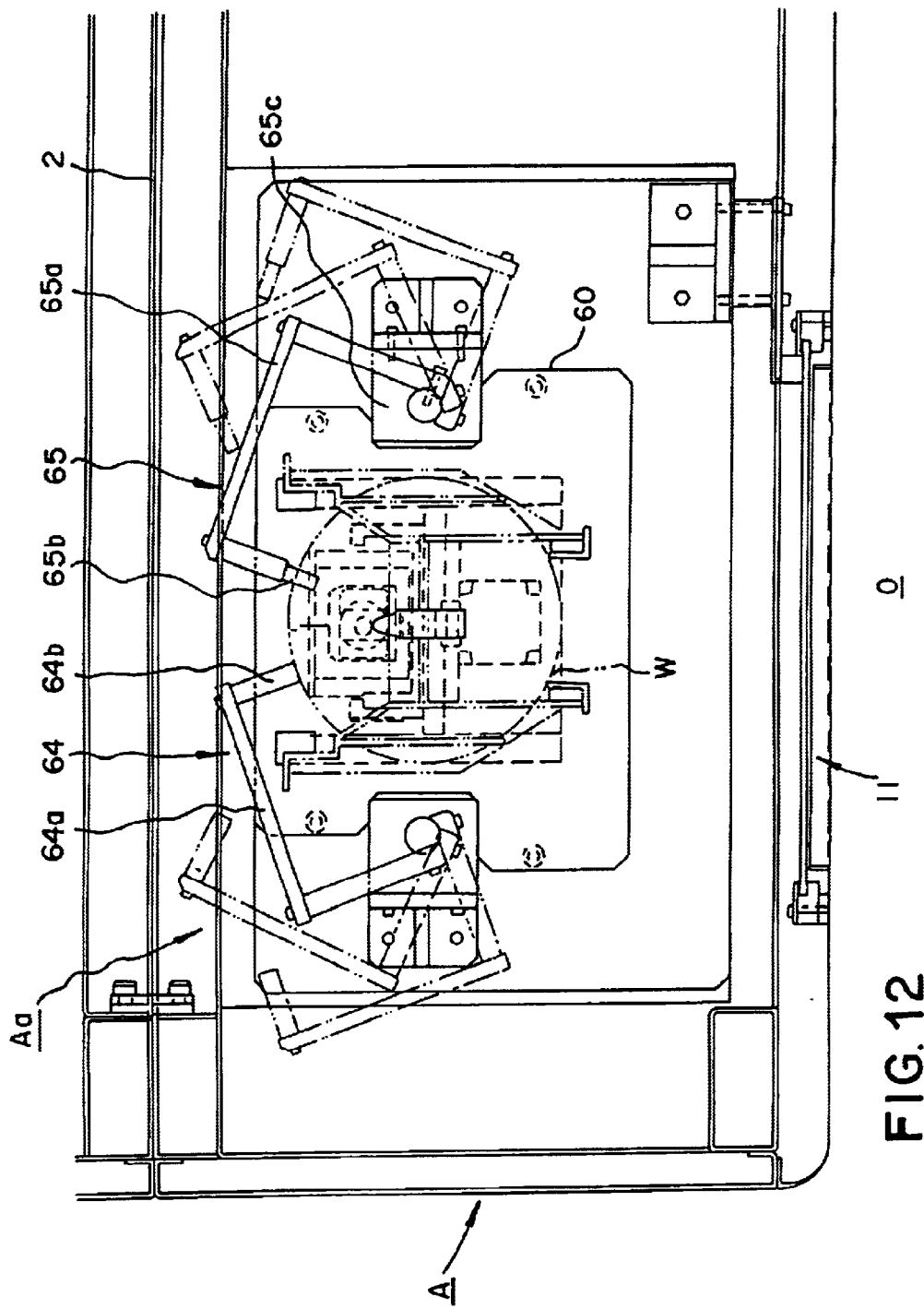
FIG. 12 is a plan view showing a wafer matching sensor and a substrate jumping correction unit of the loading/unloading booth A.
Figure 13:
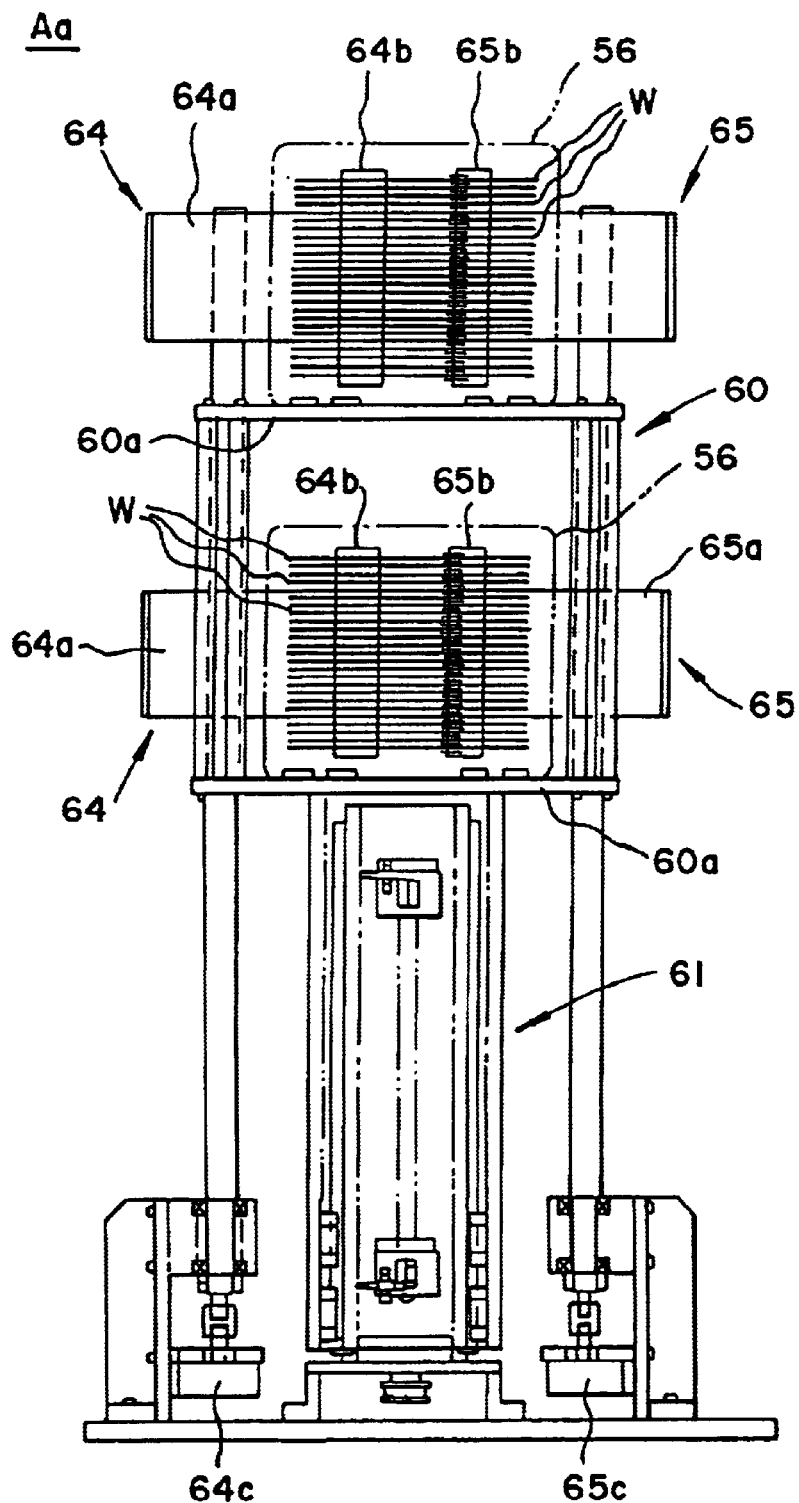
FIG. 13 is a rear view showing the wafer matching sensor and the substrate jumping correction unit of the loading/unloading booth A.
Figure 14:
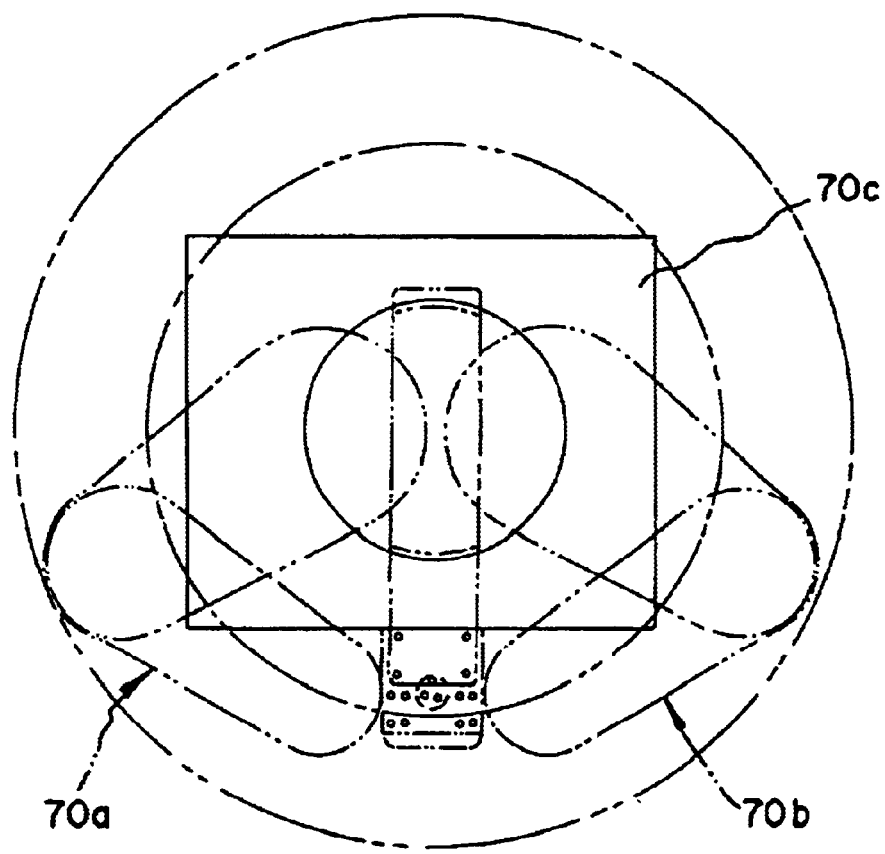
FIG. 14 is a plan view showing a transport robot in a robot booth of the substrate cleaning system.
Figure 15:
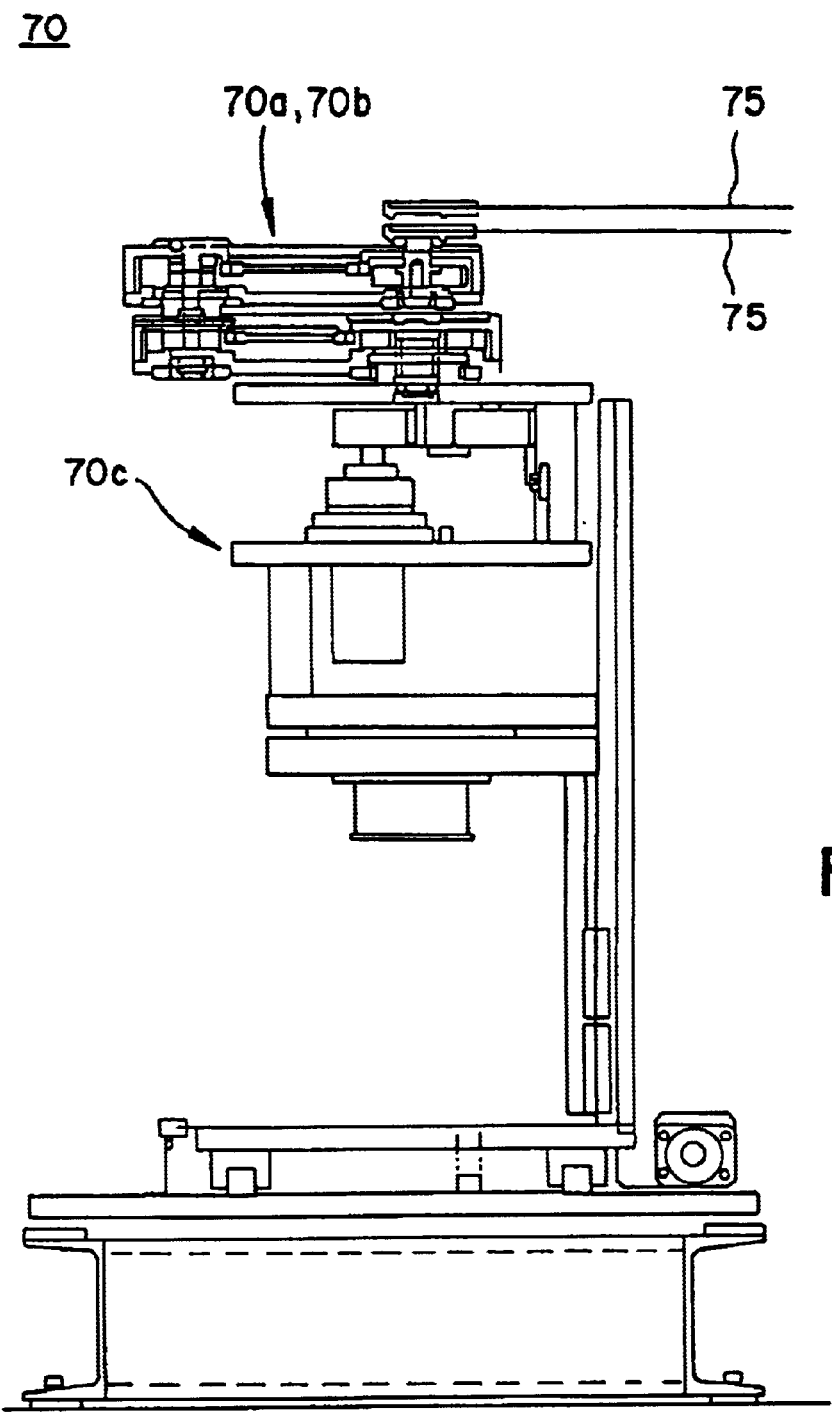
FIG. 15 is a side view showing the transport robot in the robot booth of the substrate cleaning system.

The wafer mapping sensor 65 is a transmission optical sensor for controlling the driving of the transport robot 70 in the robot booth B, and as shown in FIGS. 12 and 13, it has a comb-shaped sensor 65b having a plurality of grooves corresponding to the wafers W, W, . . . at the tip end of the horizontally swingable swing arm 65a, and a driving motor 65c for swinging the swing arm 65a.

The swing arm 65a of the wafer mapping sensor 65 is horizontally swung relative to the carriers 56, 56 on the holding tables 60a, 60a when the driving motor 65c is driven so that the sensor 65b approaches the wafers W, W, . . . in the carriers 56, 56 so as to detect how the wafers W, W, . . . are aligned on the carriers 56, 56 and whether a portion where the wafers W, W, . . . are not aligned is present or not in the carriers 56, 56. The result of detection is supplied to a system controller E, where the movement of the transport robot 70 is controlled. The wafer mapping sensor 65 operates only one time when the carriers 56, 56 are placed on the holding tables 60a, 60a.

The system controller E controls the driving of the transport robot 70 by selecting one of the following four setting manners according to the preferred embodiment shown in the figures. That is, i) each wafer W is taken out from each carrier 56 from the upper side of each carrier 56 of the carry-in section Aa, and the processed each wafer W is taken in each carrier 56 from the upper side of the carrier 56 of the carry-out section Ab, ii) each wafer W is taken out from each carrier 56 from the upper side of each carrier 56 of the carry-in section Aa, and the processed wafer W is taken in each carrier 56 from the lower side of the carrier 56 of the carry-out section Ab. iii) each wafer Wis taken out from the carrier 56 from the lower side of the carry-in section Aa, and the processed wafer W is taken in each carrier 56 from the upper side of the carry-out section Ab, iv) each wafer W is taken out from the carrier 56 from the lower side of the carry-in section Aa, and the processed each wafer W is taken in each carrier 56 from the lower side of the carry-out section Ab.

The carry-out section Ab has substantially the same basic construction as the carry-in section Aa except that the wafer mapping sensor 65 is not provided, and the closing opening 12 has the same construction as the closing opening 11.

The loading/unloading booth A has the construction that the wafers W, W, . . . stocked in the carry-in section Aa and carry-out section Ab are horizontally aligned in a vertical direction at a given alignment pitch, and the clean air flowing in the loading/unloading booth A directs from the carry-out section Ab to the carry-in section Aa. More in detail, the clean air absorbed through the HEPA filter 13 provided in front of the system body 1 passes between the processed wafers W, W, . . . in the carry-out section Ab serving as the unloader side, then passes between the wafers W, W, . . . , before they are processed, in the carry-in section Aa serving as a loader side, and finally supplied to a duct of a factory, not shown, through the air discharge opening 51 provided at the back of the system body 1.

When air current of the clean air is controlled considering the arrangement of the wafers W, W, . . . , high cleanliness of the processed wafers W, W, . . . can be assured. In association with this, the clean air flowing in the robot booth B and processing booth C is directed vertically downward from HEPA filters 66, 67 provided on a ceiling of the system body 1, and is supplied to a duct of a factory, not shown, through the air discharge opening 52 provided at the back of the system body 1 while the partition walls 2, 3 rectify the clean air flowing in the loading/unloading booth A and also serve as partition walls relative to a flow passage of clean air flowing in the loading/unloading booth A, so that smooth air flow passage in the system body 1 is assured.

A driving section of a mechanism in the loading/unloading booth A, namely, the mechanical driving sections of the elevation positioning unit 61, wafer jumping alignment mechanism 64, wafer mapping sensor 65 and the like are respectively disposed below the height of 900 mm in accordance with a SEMI standard, and a counter measure for preventing the generation of dust is taken by the mechanical driving sections.

III. Robot Booth B

The robot booth B is a section for transporting the wafers W, W, . . . one by one between the loading/unloading booth A and processing booth C, and it communicates with the loading/unloading booth A through the openings 55, 55 of the partition wall 2, and also communicates with the processing booth C through the openings 72, 72 of the partition wall 3. A sectional area of the opening 72 is set to the required minimum size, namely, to the minimum size such that hands of the transport robot 70 can hold the wafers W, W, . . . and can be inserted in the opening 72 like the opening 55 of the partition wall 2.

An ionizer 94' is provided at the upper side of the openings 72, 72 (see FIG. 6), wherein, an ion shower is effected (supply of ionized $N_2$ and the like) on each wafer W by the ionizer 94' when it is moved in the substrate cleaning chamber 10 or moved out therefrom so as to prevent each wafer W from being electrostatically charged. That is, since the ionizer 94' is rotated in the substrate cleaning chamber 10 at high speed when each wafer W is dried, there is a high possibility that electrostatic charge is produced in each wafer W which is then electrostatically charged. The ionizer 94' is provided for preventing dust and the like from sticking to each wafer W, which is caused by an electrostatic charge.

The robot booth B comprises the transport robot 70 and substrate reversing unit 71 as its main constituents.

The transport robot 70 transports the wafers W, W, . . . one by one in horizontal state between the substrate carry-in section Aa and the substrate cleaning chamber 10 and between the substrate cleaning chamber 10 and the substrate carry-out section Ab while the wafers W, W, . . . are held in a horizontal state.

More in detail, the transport robot 70 is formed of a twin arm robot provided with pair of hand sections 70a, 70b which move up and down vertically and horizontally. The hand sections 70a, 70b are constructed such that one hand section 70a places each wafer W on the substrate carry-in section Aa before it is processed, while the other hand section 70b places each wafer W on the substrate carry-out section Ab after it is processed, thereby preventing impurities such as particles from sticking to each processed wafer W.

Substrate holding sections 75 provided at the tip ends of the hand sections 70a, 70b of the transport robot 70 are formed of a soft landing type supporter for placing and supporting the lower surface of each wafer W, thereby preventing each wafer W from being damaged.

More in detail, the transport robot 70 is horizontally movable in the robot booth B in a width direction while the hand sections 70a, 70b of the transport robot 70 are provided in a robot body 70c to be movable vertically and turnably therein. A driving source of the hand sections 70a, 70b is a driving motor installed inside the robot body 70c. A ceramic fork member is employed by the substrate holding sections 75 although the detailed construction is not illustrated, and each wafer W is held horizontally on the flat upper surfaces of the substrate holding sections 75 from the lower side thereof. An outer peripheral edge of each wafer W is positioned by a plurality of positioning pins which are tapered and provided on the upper surface of the substrate holding sections 75.

The transport robot 70 may be formed of a conventionally well known vacuum suction type transport robot, not shown. For this purpose, the substrate holding sections 75 provided at the tip end of the hand sections 70a, 70b can be replaceable with a substrate suction section for vacuum-sucking and chucking each wafer W, and can communicate with a negative pressure source such as vacuum pump and the like, not shown.

The transport robot 70 turnably moves each wafer W at a given angular interval in the horizontal direction when each substrate holding section 75 takes out each wafer W in each carrier 56 of the substrate carry-in section Aa or each wafer W on a substrate supporting section 104 of the substrate cleaning chamber 10 while it is placed horizontally by the handling operation of the hand sections 70a, 70b, then it transports each wafer W on the substrate supporting section 104 or on each carrier 56 of the substrate carry-out section Ab.

When each wafer W is carried in or carried out from each carrier 56 by the elevation positioning unit 61 which is interlocked with the operation of the transport robot 70, each carrier 56 moves up and down in a vertical direction by one pitch in the substrate carry-in section Aa or substrate carry-out section Ab, thereby positioning the wafers W, W, . . . so as to carry each wafer W in each carrier 56 or carry out each wafer W from each carrier 56.

It is needless to say to employ the construction contrary to the preferred embodiment as illustrated such that the hand section 70a or 70b of the transport robot 70 is controlled to be driven so as to sequentially repeat the foregoing operations after it is moved up and down in the vertical direction by one pitch when each wafer W is carried in or out from each carrier 56, thereby dispensing with the elevation positioning unit 61 in this case.

The substrate reversing unit 71 turns each wafer W upside down, and operates to apply cleaning treatment not only to the front face of each wafer W but also to a back face thereof.

Figure 16:
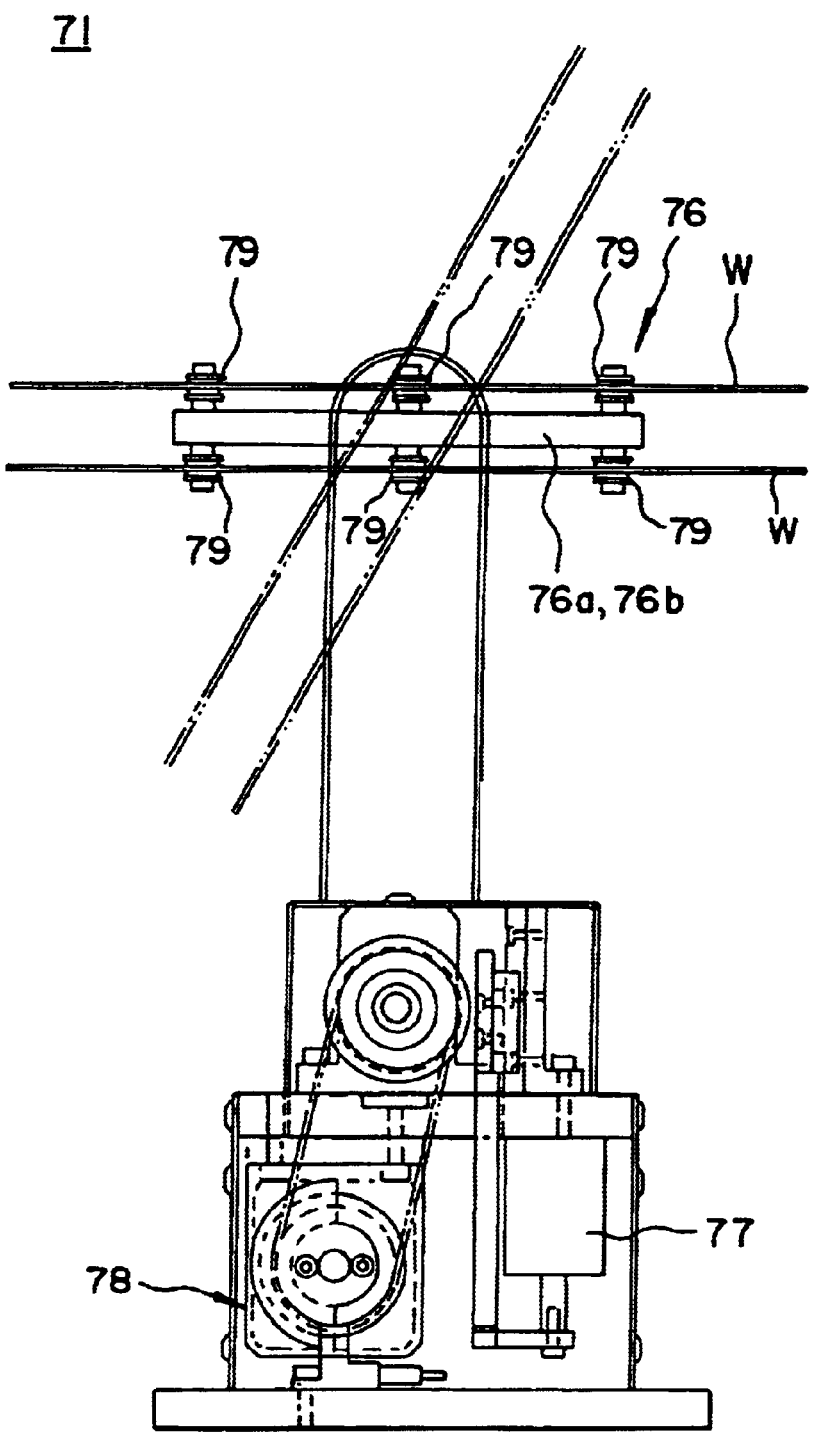
FIG. 16 is a front view showing a substrate reversing unit in a robot booth of the substrate cleaning system.
Figure 17:
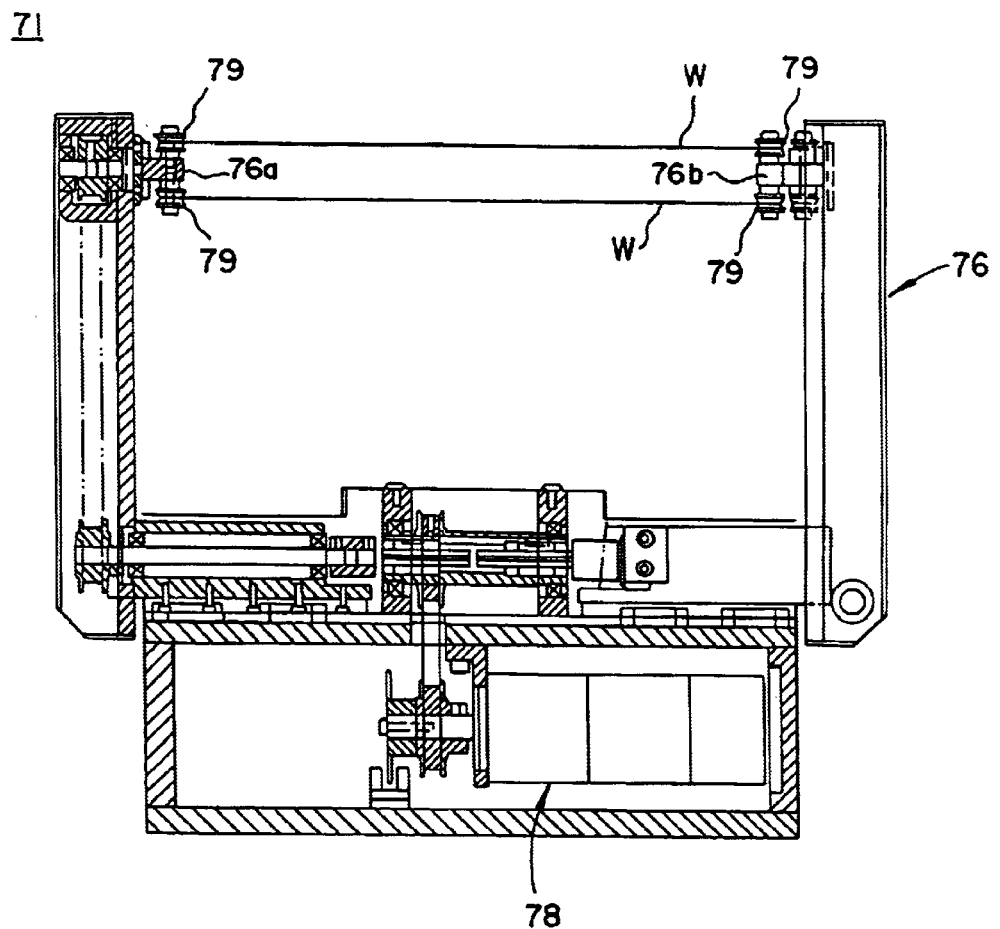
FIG. 17 is a side sectional view of the substrate reversing unit of the substrate cleaning system.
Figure 18:
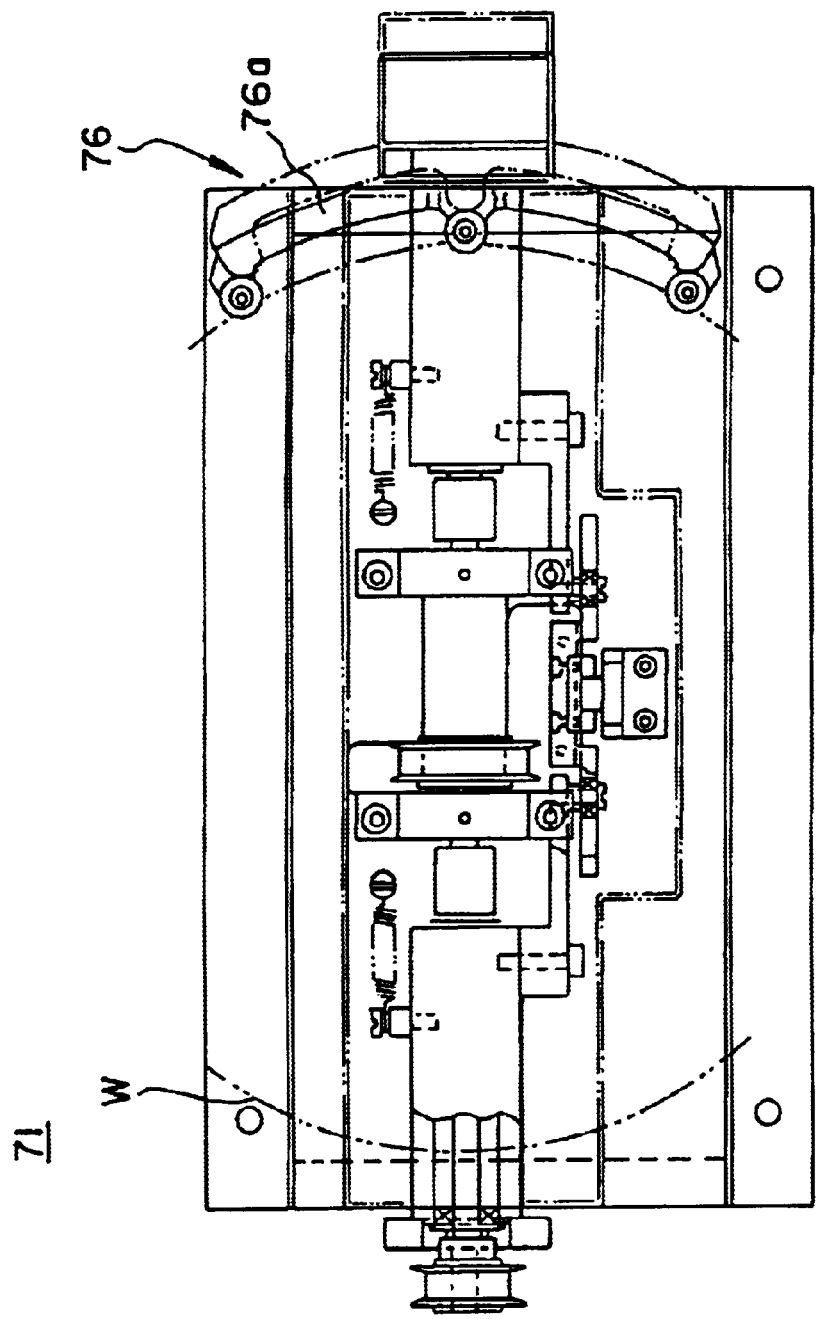
FIG. 18 is a plan view of the substrate reversing unit of the substrate cleaning system.
Figure 19:
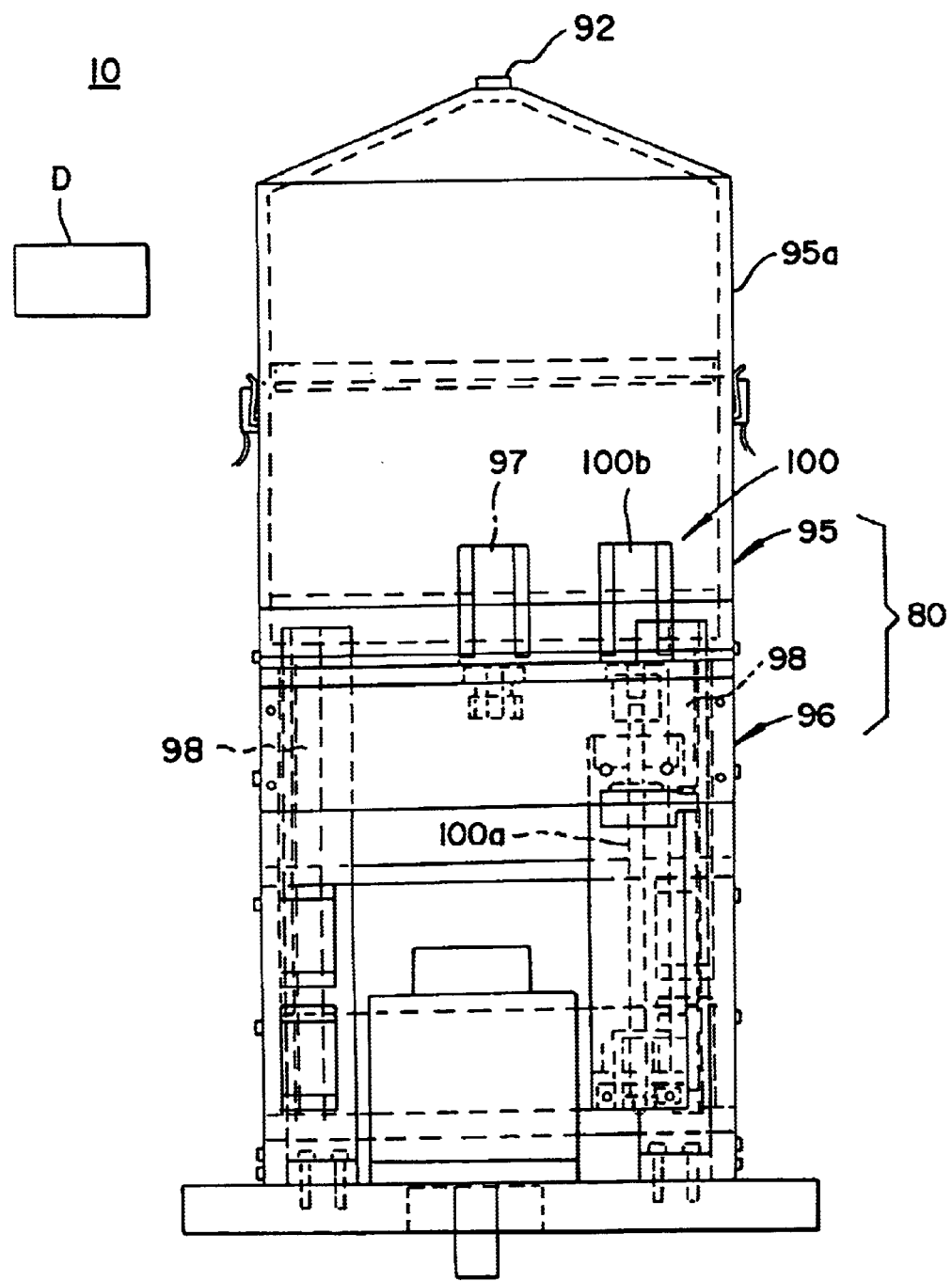
FIG. 19 is a side view showing a substrate cleaning chamber in a processing booth of the substrate cleaning system.
Figure 20:
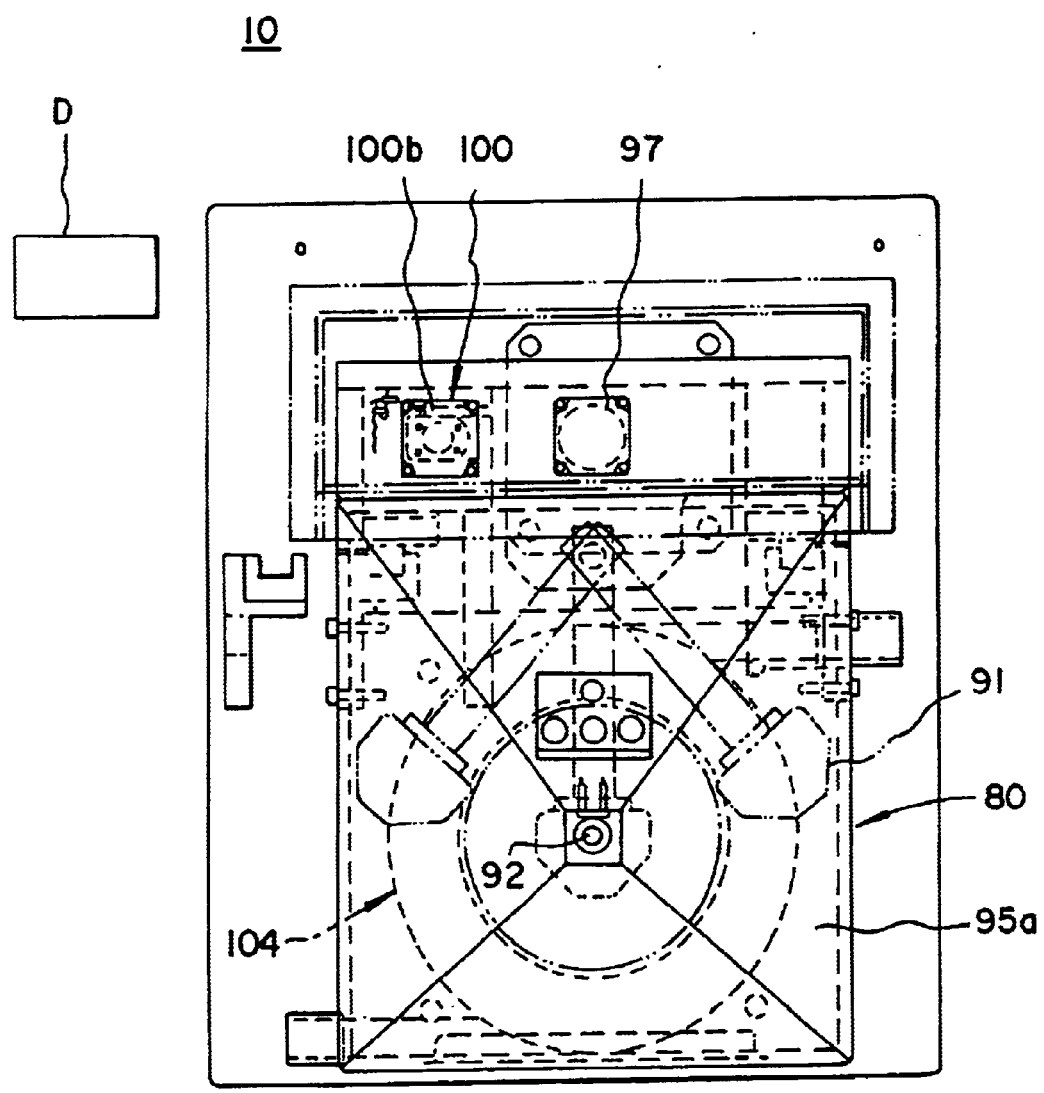
FIG. 20 is a plan view showing a substrate cleaning chamber in the processing booth of the substrate cleaning system.
Figure 21:
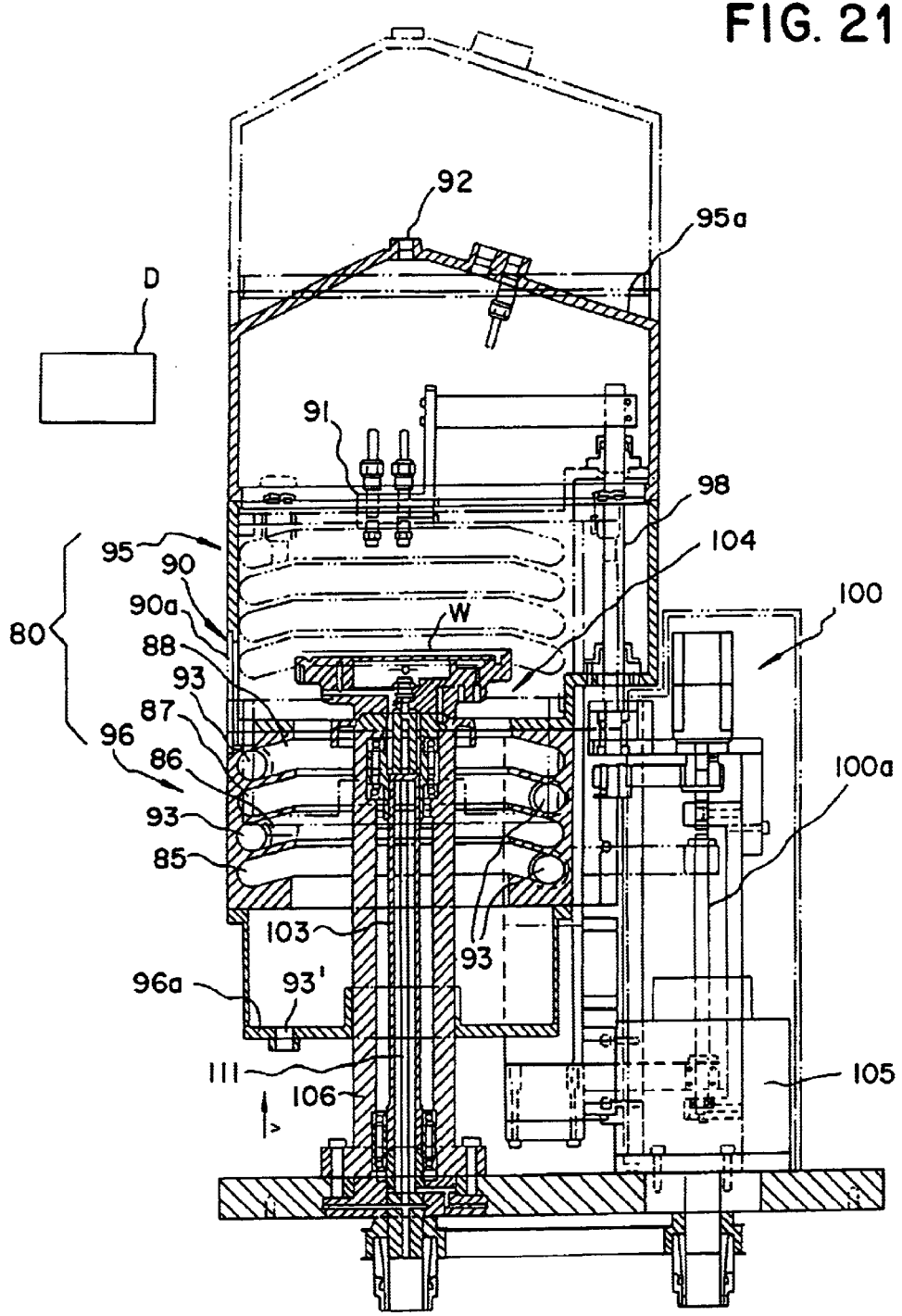
FIG. 21 is a front sectional view showing the substrate cleaning chamber in the processing booth of the substrate cleaning system.

More in detail, the substrate reversing unit 71 comprises, as shown in FIGS. 16 to 18, a chuck mechanism 76, a cylinder unit 77, and a driving motor 78 as its main constituents. The chuck mechanism 76 chucks and supports each wafer W at its outer peripheral edge so as to grip it, and comprises a pair of movable chucks 76a, 76b so as to be opened or closed. Supporting rollers 79, 79, 79 each having a circular groove for supporting each wafer W while engaging with the outer peripheral edge thereof are disposed circularly corresponding to the circumference of each wafer W, and they are paired and disposed coaxially so as to chuck and support two wafers W, W at the same time.

Each of the movable chucks 76a, 76b operates to be opened or closed by the cylinder unit 77 toward the center thereof in a horizontal direction. The cylinder unit 77 comprises an air cylinder which is operable by a pressurized air as an operation medium.

The movable chucks 76a, 76b are turnably supported vertically by the driving motor 78 via a driving belt mechanism.

When a cleaning treatment is applied not only to the front face of each wafer W but also to the back face thereof, the wafers W, W to which the cleaning treatment was applied at the front face are transported to the substrate reversing unit 71 where they are turned upside down. That is, the substrate reversing unit 71 operates the chuck mechanism 76 by the cylinder unit 77 so that the chuck mechanism 76 chucks and supports two wafers W, W at the outer peripheral edges so as to grip them, then it turns the chuck mechanism 76 which chucks and supports two wafers W, W by 180 degrees at low speed when the driving motor 78 is driven so that two wafers W, W are reversed. Two wafers W, W which are turned upside down are supplied to the substrate cleaning chambers 10, 10 of the processing booth C by the transport robot 70 while the back faces thereof are directed upward before they are processed, and then cleaning treatment is applied to the back face thereof.

A driving section of a mechanism in the robot booth B, namely, the mechanical driving sections of the transport robot 70 and the substrate reversing unit 71 are all disposed below the height of 900 mm in accordance with a SEMI standard, and the mechanical driving sections take a counter measure for preventing the generation of dust like the loading/unloading booth A.

IV. Processing Booth C

The processing booth C has at least one substrate cleaning chamber 10 for applying a cleaning treatment to the wafers W, W, . . . one by one by a plurality of cleaning solutions, and it is formed of a twin chamber type provided with two substrate cleaning chambers 10, 10 according to the preferred embodiment of the invention as set forth above. The processing booth C may be formed of a three chamber type or a four chamber type as enhancing a throughput by appropriately increasing the number of substrate cleaning chamber 10.

Figure 22:
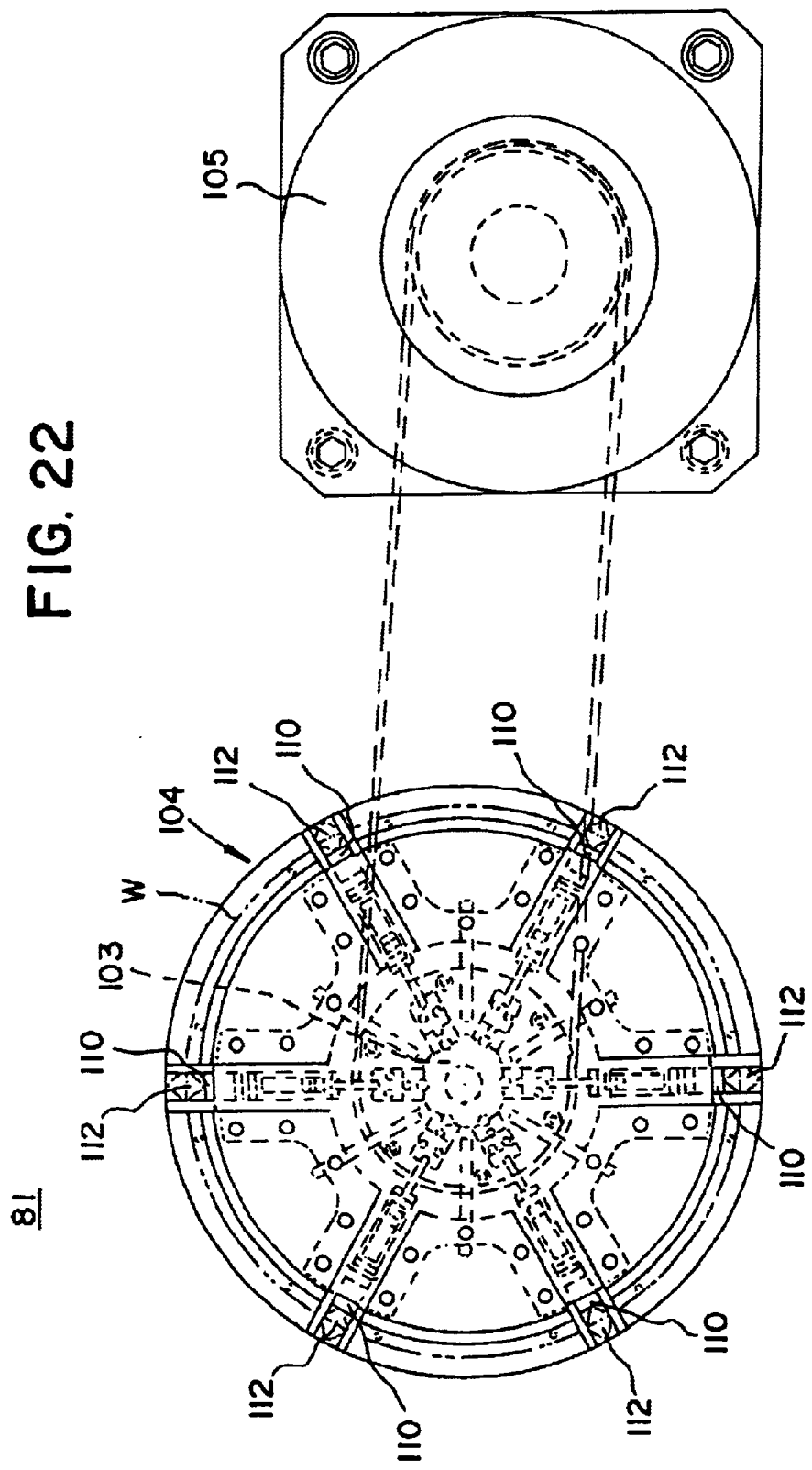
FIG. 22 is a plan view of a spin unit of the cleaning chamber of the substrate cleaning system.
Figure 23:
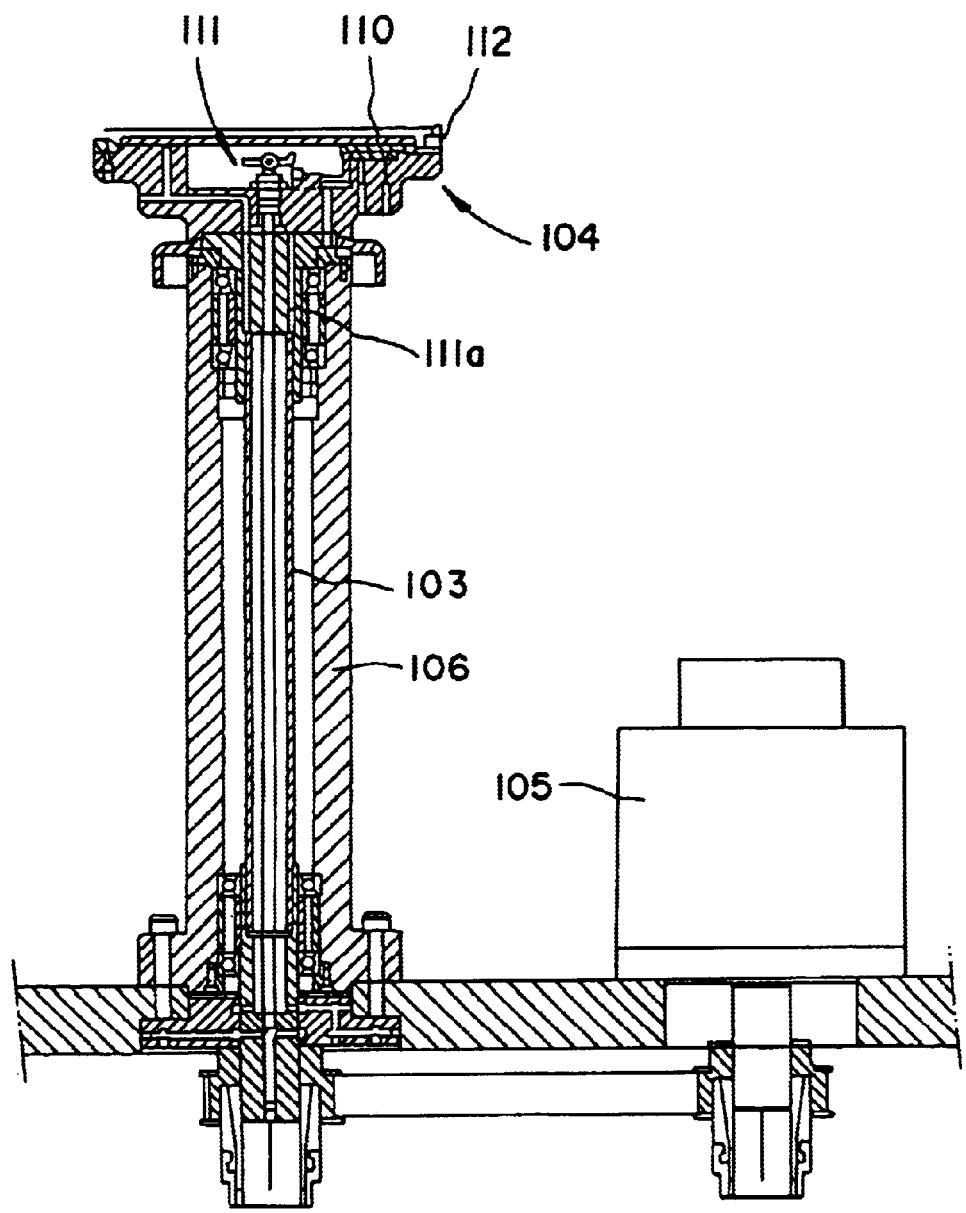
FIG. 23 is a front sectional view of the spin unit of the cleaning chamber of the substrate cleaning system.
Figure 24:
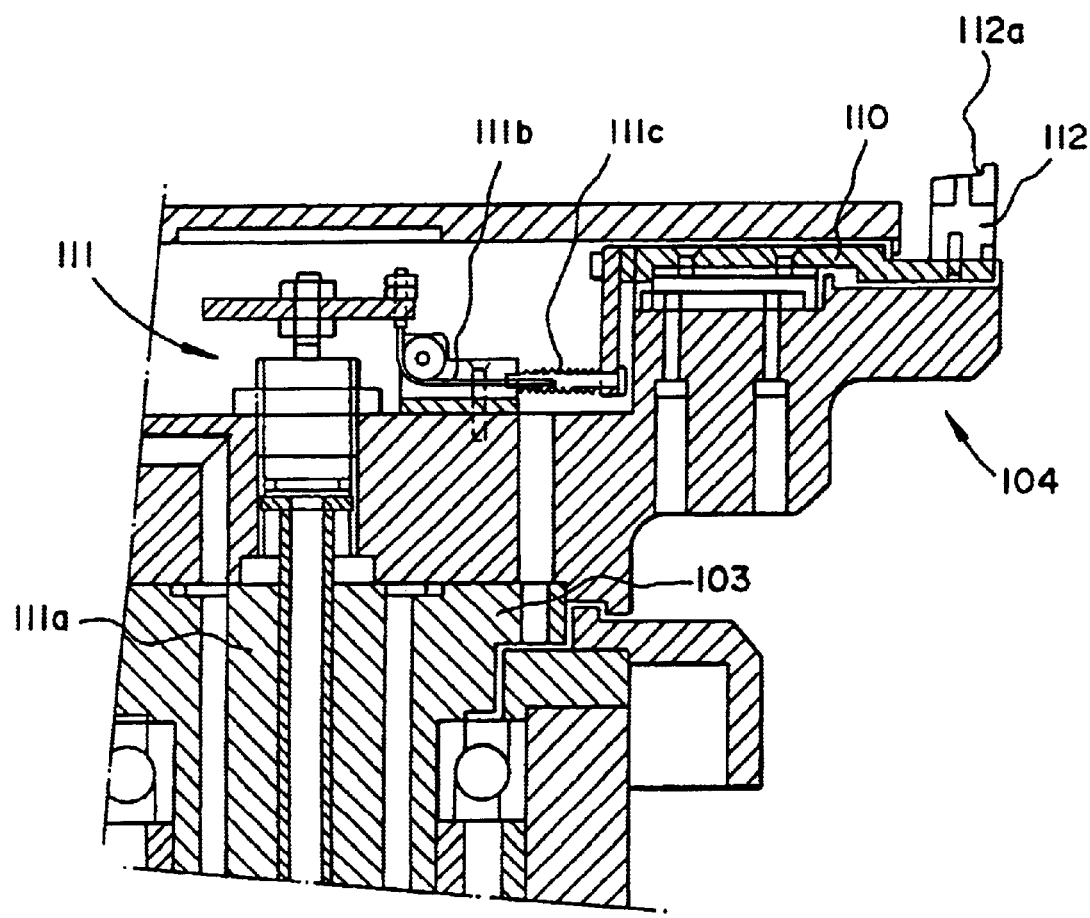
FIG. 24 is a front sectional view enlarging a main part of a substrate supporting section of the spin unit of the substrate cleaning system.

The substrate cleaning chamber 10 comprises, as shown in FIGS. 22 to 24, a chamber body 80 which is relatively movable vertically and has substrate rotary units 81 as its main constituents, wherein the substrate rotary units 81 are disposed coaxially at the center of the chamber body 80.

The chamber body 80 is provided with a plurality of (four in the preferred embodiment) circular processing baths 85 to 88 which are aligned vertically, and it can be moved up and down.

More in detail, the chamber body 80 is formed of a sealed container provided with an openable substrate carry-in gate 90 and comprises a chemical supply section 91, an inert gas supply section 92, and drain sections 93, 94 and the like.

The chamber body 80 is formed of a single cleaning bath which can be sealed and store one wafer W, and comprises an upper processing standby section 95 and a lower processing section 96.

The upper processing standby section 95 is a section for carrying each wafer W therein and carrying out each wafer W therefrom, a gate 90 through which each wafer W is carried in or out is provided at the side of the upper processing standby section 95 and a chamber cover 95a which is movable with a single motion at the upper half of the upper processing standby section 95 so that the maintenance of the interia of the chamber body 80 can be easily effected.

The gate 90 is openable and closable and constitutes the substrate carry-in/out opening of the chamber body 80. More in detail, the gate 90 has a sectional area through which the hand sections 70a, 70b of the transport robot 70 which hold each wafer W in a horizontal state can pass. A door 90a of the gate 90 is openable and closable vertically by a driving source such as an air cylinder with airtightness and watertightness.

The chemical supply section 91 and inert gas supply section 92 are provided in the upper processing standby section 95.

The chemical supply section 91 supplies cleaning solution onto each wafer W supported by the substrate rotary units 81. More in detail, the chemical supply section 91 is formed of an injection nozzle for injecting and supplying cleaning solution onto the front face of each wafer W which is supported by the substrate supporting section 104 of the substrate rotary units 81 from the upper side thereof.

The chemical supply section 91, i.e., the injection nozzle 91, is provided in the upper processing standby section 95 of the chamber body 80 in a state where it is directed downward and horizontally turnable, and it can communicate with the cleaning solution supply unit D. Depicted by 97 is a driving motor for swinging the injection nozzle 91.

The injection nozzle 91 injects and supplies cleaning solution onto the front face of each wafer W which is turnably supported horizontally by the substrate supporting section 104 of the substrate rotary units 81 while it is horizontally turned from the outer periphery to the center thereof or after it is horizontally turned and stopped.

Four nozzle ports are defined (not shown) in the injection nozzle 91 according to the preferred embodiment of the invention, and function as supply ports of an APM solution, pure water, DHF solution and $N_2$ respectively described later. These nozzle ports are elliptic and supplies widely and elliptically these solutions onto the front face of each wafer W. As a result, cleaning solution can be supplied and distributed to the front face of each wafer W quickly and uniformly while interlocking with the rotary motion of each wafer W.

The inert gas supply section 92 supplies inert gas for charging and exchanging cleaning solution inside the chamber body 80, and it is installed on the top of the upper processing standby section 95 and can communicate with an inert gas supply source (not shown). In the preferred embodiment, $N_2$ is employed as an inert gas. The inert gas supply source can also communicate with the injection nozzle 91, and the injection nozzle 91 also functions as an inert gas supply section.

The lower processing section 96 is a section for applying a cleaning treatment to each wafer W, and inner diameter dimensions thereof are set at appropriate values in association with the substrate supporting section 104 of the substrate rotary units 81, described later. More in detail, they are set to have a very small interval to the extent that a circular gap defined between the outer diameter edge of the substrate supporting section 104 and an inner diameter edge of the lower processing section 96 while they do not contact each other so as to prevent cleaning solution and the like from leaking downward therebetween.

Four circular processing baths 85 to 88 are installed in the lower processing section 96 vertically, in a multistage or in a layer, wherein the drain sections 93, 94 for communicating with the outside of the system body 1 are installed in the circular processing baths 85 to 88 and a bottom 96a of the lower processing section 96, whereby cleaning solution or inert gas inside the circular processing baths 85 to 88 is discharged outside the system via the drain sections 93, 94. The drain sections 93 of the circular processing baths 85 to 88 are opened only when cleaning treatment is effected in the circular processing baths 85 to 88 and is closed when cleaning treatment is effected in other processing baths.

The chamber body 80 is supported to be movable up and down vertically via an LM guide 98, and has an elevating mechanism 100 which moves up and down relative to the substrate supporting section 104 of the substrate rotary units 81 by a given stroke.

The elevating mechanism 100 comprises a lead screw mechanism 100a for moving the supporting frame 62 up and down and a driving motor 100b for rotatably driving the lead screw mechanism 100a.

The chamber body 80 is moved up and down vertically every given stroke when the driving motor 100b is driven while interlocking with the operation of the substrate rotary units 81, described later, via the lead screw mechanism 100a so that one of the circular processing baths 85 to 88 for effecting a cleaning treatment is selectively positioned in its height direction relative to the substrate supporting section 104 of the substrate rotary units 81.

Each substrate rotary unit 81 horizontally rotates one wafer W while supporting it in a horizontal state when affecting spin cleaning and spin drying, and the substrate supporting section 104 is horizontally attached and supported by the tip end of the rotary shaft 103 as shown in FIGS. 21 to 24. Each substrate rotary units 81 is provided with a driving motor 105 for rotatably driving the rotary shaft 103.

The substrate supporting section 104 and the rotary shaft 103 are concentrically and rotatably respectively disposed at the center of the chamber body 80 via a bearing supporting cylinder 106, and one wafer W is supported by the substrate supporting section 104 in a horizontal state. More in detail, as shown in FIGS. 22 to 24, the substrate supporting section system body 104 is provided with a plurality of (six in these figures) chucking arms 110, 110, . . . for chucking and supporting the peripheral edge of the wafer W.

The chucking arms 110, 110, . . . are disposed radially in a horizontal state as shown in FIGS. 22 to 24, and they are reciprocally movable in a radial direction by a closing mechanism 111. Chucking pawls 112, 112, . . . are respectively provided on the tip ends of the chucking arms 110, 110, . . . are set to become the same height, whereby the peripheral edge of each wafer W is chucked and supported in a horizontal state.

Each chucking surface 112a of each chucking pawl 112 has a sectional shape corresponding to a sectional shape of the peripheral edge of each wafer W. That is, although not illustrated in detail, each chucking surface 112a has a plane which is inclined up and down at right angles, and the peripheral cornered edge thereof can contact and support the peripheral edge of each wafer W which is rectangular in cross section in a point contact state or a line contact state while former support the latter.

As a result, when the chucking arms 110, 110, . . . chuck the peripheral edge of each wafer W, the peripheral edge of each wafer W is supported vertically by each chucking surface 112a in a restrained state. In this supporting state, the peripheral edge of each wafer W is not fixed but permitted to be moved to an extent. With such a construction, only the peripheral edge of each wafer W is supported, the back face of each wafer W is not contaminated. Further, since the shape of each chucking surface 112a corresponds to a sectional shape of the peripheral edge of each wafer W, the peripheral edge of each wafer W is not tipped.

The closing mechanism 111 comprises a cylinder unit 111a provided in the rotary shaft 103 and connection wires 111b, 111b, . . . for connecting between the cylinder unit 111a and the chucking arms 110, 110, . . . as main constituents.

The chucking arms 110, 110, . . . are pulled in a radial direction via the connection wires 111b, 111b, . . . when the cylinder unit 111a protrudes so that the chucking arms 110, 110, . . . effect a chucking operation while they are pushed out in a radial direction by an elastic restoring force of restoring springs 111c, 111c, . . . when the cylinder unit 111a draws away so that the chucking arms 110, 110, . . . effect a chucking releasing operation.

The rotary shaft 103 is rotatably supported in an upright state via the bearing supporting cylinder 106, while the lower end thereof is connected to the driving motor 105 to be driven by a belt so that the rotary shaft 103 is rotatably driven by the driving motor 105, and hence the substrate supporting section 104 is rotated at a given rpm. In a preferred embodiment, the rotational speed of the bearing supporting cylinder 106 is set at 40 to 50 rpm when effecting a spin cleaning treatment while it is set at about 3000 rpm when effecting spin drying treatment.

With the substrate cleaning chamber 10 having the foregoing construction, the positioning between each wafer W supported on the substrate supporting section 104 of the substrate rotating unit 81 and either of the circular processing baths 85 to 88 can be selectively effected when the chamber body 80 is moved up and down vertically while each wafer W supported by the substrate supporting section 104 is horizontally rotated by the substrate rotating unit 81 at a given rotational speed.

With the construction of the substrate cleaning chamber 10, since the up-and-down movements of the substrate rotating unit 81 is fixed while the chamber body 80 is moved up and down, the supporting construction of the substrate rotating unit 81 which is rotated by high speed is simple and firm so that the generation of rotary oscillation at the rotary section of the substrate rotating unit 81, i.e., substrate supporting section 104 is effectively prevented. As a result, a very small gap defined between the inner diameter edge of the lower processing section 96 and the outer diameter edge of the substrate supporting section 104 of the substrate rotating unit 81 is maintained correct, thereby obtaining an advantage that leakage of cleaning solution in the downside direction can be stably prevented for a long period of time. However, a construction opposite to this construction can be employed in response to the object, namely, the substrate rotating unit 81 can secure the up-and-down movements, and the up-and-down movements of the chamber body 80 can be fixed.

V. Cleaning Solution Supply Unit D

The cleaning solution supply unit D is a supply source for supplying the cleaning solution to the substrate cleaning chamber 10 in the processing booth C, and it employs two chemical system in the preferred embodiment, namely, it selectively comprises a construction for effecting a cleaning treatment by use of APM ($NH_4OH+H_2O_2+H_2O$) solution or a construction for effecting a cleaning treatment by use of DHF ($HF+H_2O$) solution. With the circular processing baths 85 to 88 in the chamber body 80 of the substrate cleaning chamber 10, the lowermost stage processing bath 85 is used for effecting a cleaning treatment by the APM solution and the next upper stage processing bath 86 is used for effecting a cleaning treatment by the DHF solution, and the next upper stage processing bath 87 is used for rinsing by pure water, and the uppermost stage processing bath 88 is used for spin drying.

When a recipe in a cleaning treatment is selected and set, it is possible to selectively effect one of cleaning treatments such as i) APM+DHF+$O_3$+DIW+DRY, ii) APM+DHF+DRY, and iii) APM+DRY and DHF+DRY.

VI. System Control Unit E

The system control unit E controls the carry-in section Aa, transport robot 70, substrate reversing unit 71, substrate cleaning chambers 10, 10, and carry-out section Ab while interlocking therewith, wherein a series of wet cleaning treatment steps in the substrate cleaning system, described later, can be automatically effected, namely, from a pre-step for carrying in each wafer W to a next step for carrying out each W.

(1) Carrying-in of the Wafers W, W, . . . :

The wafers W, W, . . . are transported to the operating space O in a vertical state where they are stocked by the carriers 56, 56, . . . by an AGV and the like from a pre-step.

When the loader opening 11 of the system body 1 is opened, the wafers W, W, . . . , before cleaning treatment, are changed in their postures from a vertical state to a horizontal state when the carriers 56, 56, . . . are felled, then, they are carried in and located on the two stage holding tables 60a, 60a of the substrate holding section 60 in the carry-in section Aa of the loading/unloading booth A while they are stored in the carriers 56, 56, . . . through the loader opening 11 by use of an automatic carry-in unit (not shown) or by a manual operation of an operator.

In this case, the substrate holding section 60 is moved upward by the elevation positioning unit 61 after the carrier 56 is placed on the upper side first stage holding table 60a, and the next carrier 56 is placed on the lower side second stage holding table 60a.

After the loader opening 11 is closed again, the presence of inclination of the carrier 56 is detected by the carrier inclination detection sensor 63. If there is no inclination of the carrier 56, each wafer W is aligned by the wafer jumping alignment mechanism 64, while the alignment stage of the wafers W, W . . . is detected by the wafer mapping sensor 65 so that the transport robot 70 in the robot booth B is rendered standby.

The transport robot 70 takes out wafers W, W . . . in the carriers 56, 56, . . . while they are held in the horizontal state in response to the result of detection by the wafer mapping sensor 65, and it carries the wafers W, W . . . in the chamber body 80 of the substrate cleaning chamber 10 in the processing booth C.

The wafers W, W . . . are taken out by the transport robot 70 through the opening 55 of the partition wall 2 while interlocking with the positioning operation of the carrier 56 by the elevation positioning unit 61 in accordance with the result of detection by the wafer mapping sensor 65, and they are taken out sequentially from the uppermost wafer W or the lowermost wafer W.

Meanwhile the carry-in operation of each wafer W by the transport robot 70 is effected in a state where the substrate supporting section 104 of the substrate cleaning chamber 10 is moved upward to be rendered standby in a wafer carry-in-out position in the upper processing standby section 95 of the chamber body 80 through the opening 72 of the partition wall 3 and the gate 90 of the chamber body 80. The gate 90 is opened only when each wafer W is carried in or out so that dispersion of fume in the chamber body 80 or entrance of particles in the chamber body 80 is effectively prevented.

When each wafer W is carried in onto the substrate supporting section 104 in the chamber body 80, the chucking arms 110, 110, . . . chuck the peripheral edge of each wafer W in a horizontal state and support it.

(2) Wet Cleaning Treatment in the Substrate Cleaning Chamber 10:

When the substrate supporting section 104 chucks and supports each wafer W, each wafer W is positioned to a wafer cleaning treatment position in the lower processing section 96 when the chamber body 80 is moved up and down, then a variety of cleaning treatments are effected in a predetermined procedure.

In the case of the cleaning treatment step, for example, in the foregoing ii) (APM+DHF+DRY) treatment, each wafer W on the substrate supporting section 104 is first positioned and disposed in the lowermost stage processing bath 85 when the chamber body 80 is moved up and down and positioned so that an APM solution is supplied through the ejection nozzle 91, then spin cleaning is effected by the substrate rotating unit 81 at low rpm, thereafter each wafer W is positioned and disposed in the second stage processing bath 87 from the above, thereafter rinsing is effected by the substrate rotating unit 81 at low rpm, while pure water is supplied through the chemical supply section 91. Subsequently each wafer W is positioned and disposed in the third stage processing bath 86 from the above, and a DHF solution is supplied to each wafer W through the ejection nozzle 91, then spin cleaning is effected by the substrate rotating unit 81 at low rpm, thereafter it is further positioned and disposed in the processing bath 87 where rinsing is effected by the substrate rotating unit 81 at low rpm while pure water is supplied thereto through the ejection nozzle 91. Finally, each wafer W is positioned and disposed in the uppermost stage processing bath 88 and spin drying is effected by the substrate rotating unit 81 at high rpm while an inert gas $N_2$ (nitrogen gas) is ejected through the ejection nozzle 91.

In this case, when the inert gas from the inert gas supply section 92, namely, $N_2$ (nitrogen gas) is introduced in this preferred embodiment, the interior of the chamber body 80 is purged with $N_2$, and each chamber is forcibly discharged through the drain sections 93 of the respective chambers so that an air current passage extending from the inert gas supply section 92 to the drain sections 93 of the chambers is produced, thereby effectively preventing mist inside the chamber body 80 from whirling up.

The drain sections 93 of the circular processing baths 85 to 88 are opened only when a cleaning treatment is effected in the processing baths 85 to 88, and they are closed when a cleaning treatment is effected in other processing baths, so that an $N_2$ purging effect is enhanced inside the chamber body 80.

When a series of cleaning treatments relative to the front face of each wafer W is completed, the substrate supporting section 104 is moved again upward relative to the wafer carry-in-out position inside the upper processing standby section 95 when the chamber body 80 is lowered, thereafter the transport robot 70 in the robot booth B is rendered standby.

In this case, when a cleaning treatment is applied to the back face of each wafer W, each wafer W is transported to the substrate reversing unit 71 by the transport robot 70 where it is turned upside down, then it is carried again in the substrate supporting section 104, so that a series of cleaning treatments are applied to the back face of each wafer W.

Carrying-out of Wafers W, W . . . :

A series of cleaning treatments are applied to each wafer W in the substrate cleaning chamber 10, and each wafer W is carried out again from the chamber body 80 of the substrate cleaning chamber 10 by the transport robot 70 in the manner opposite to the foregoing procedure so that it is subsequently carried out in a horizontal state and stored in the carriers 56, 56, . . . which are rendered standby on the upper and lower two stages holding tables 60a, 60a, . . . of the substrate holding section 60 in the carry-out section Ab.

A concrete carry-out operation and storing operation in this case is the same manner as the foregoing step of (1) carrying-in of the wafers W, W, . . . .

Then, when the wafers W, W . . . after cleaning treatment are aligned and filled in all the holding grooves inside the carriers 56, 56, the unloader opening 12 in the system body 1 is opened so that the carriers 56, 56 are transported to a thin film deposition process such as a spattering or CVD process and the like.

In the foregoing series of operations, the processing procedure of the wafers W, W . . . in each carrier 56 by the transport robot 70 is selected and set at one of the foregoing four methods i) to iv).

The loading operation and the unloading operation in the carry-in section Aa and carry-out section Ab of the loading, unloading booth A are actually effected at the same time.

With the substrate cleaning system having the foregoing construction, since the loading/unloading booth A, robot booth B and processing booth C are respectively installed in the system body 1, wherein these booths A, B and C are partitioned by the partition walls 2, 3 each having a required minimum sectional area, the flow of air between the interior of the system body 1 and a clean room outside the system body 1 is restrained to a required minimum extent so that the interior of the system body 1 can be maintained in a very high cleanliness atmosphere.

Furthermore, since the system is formed of a sheet-type treatment for applying a cleaning treatment to the wafers W, W . . . one by one, particles and the like are scarcely re-stuck to the wafers W, W . . . , a precise treatment is applied to every wafer, a cleaning space of the substrate cleaning chamber 10 can be rendered small and the amount of cleaning solution is also rendered small.

Further, since a cleaning treatment is applied to the wafers W, W . . . one by one by a cleaning solution, namely, one chamber type for applying all cleaning treatments in one substrate cleaning chamber 10, so that the wafers do not contact an atmosphere, and hence they are not susceptible to a metallic contamination or influence of ion and oxygen and the like, and the construction of each substrate cleaning chamber can be simplified and small sized.

Further, since the loading/unloading booth A and processing booth C are respectively installed back and forth at both sides of the system body 1, and the robot booth B is sandwiched between these booths A, C, harmful gas or particles generated when cleaning treatment is effected in the processing booth C are not leaked into an operating space 0 outside the system body 1.

Further, since the wafers W, W . . . which are stocked in the carry-in section Aa and carry-out section Ab of the loading/unloading booth A are aligned vertically in a horizontal state at a given alignment pitch, and clean air flowing horizontally in the loading/unloading booth A is directed horizontally from the carry-out section Ab to carry-in section Aa, it is possible to effectively prevent particles and the like from being re-stuck onto each wafer W after a cleaning treatment from each wafer W before cleaning treatment.

Likewise, since the transport robot 70 of the robot booth B is formed of a twin arm robot provided with a pair of hand sections wherein one hand section places thereon each wafer W before cleaning treatment and the other hand section places thereon each wafer W after cleaning treatment, it is possible to effectively prevent particles and the like from being re-stuck to each wafer W after a cleaning treatment from each wafer W before a cleaning treatment.

Although the foregoing embodiment is the preferred embodiment of the invention, the invention is not limited to this preferred embodiment but can be variously changed in design within the scope of the invention.

For example, the substrate cleaning chamber 10 according to the embodiment may have a construction that the substrate cleaning chamber 10 can be used as one chamber sheet-type substrate cleaning unit for applying a cleaning treatment to the wafers W, W . . . one by one in a single chamber body 80 by cleaning solution, even by the single cleaning system while it serves as the substrate cleaning chamber 10 which is a basic unit constituent of the substrate cleaning system, and hence the substrate cleaning system can be used singly.

Further, although cleaning solution used in the embodiment is an example thereof. and hence other cleaning solution such as HPM (HCl+$H_2O_2$+$H_2O$), SPM ($H_2SO_4$+$H_2O_2$+$H_2O$) and the like can be utilized in response to an object thereof.

As mentioned in detail above, according to the invention, since the substrate cleaning system comprises a system body 1 capable of being sealed, a loading/unloading booth A comprising a substrate carry-in section Aa in which a plurality of substrates are stocked and standby to be carried in before a cleaning treatment and a substrate carry-out section Ab in which a plurality of substrates are stocked and standby to be carried out after a cleaning treatment, a processing booth C provided with at least one sheet-type substrate cleaning chamber 10 in which a cleaning treatment can be applied to a plurality of substrates one by one by a plurality of cleaning solutions, and a robot booth B provided with a transport robot for transporting the substrates one by one between the processing booth C and the loading/unloading booth A, wherein the respective booths are partitioned by partition walls each having a required minimum cross sectional area, it is possible to provide a substrate cleaning system capable of applying a cleaning treatment to wafers in a high cleanliness atmosphere with high accuracy while preventing particles and the like from being re-stuck to the wafers taking an advantage of the sheet-type wet cleaning treatment for applying a cleaning treatment to the wafers one by one in a sealed cleaning chamber without being accommodated in a cassette, and which is simple and compact in construction, and is excellent in cost performance.

Entering upon a sub-micron application age of recent semiconductor devices, a very high cleanliness required on its surface as the construction of such a semiconductor device is micro-fabricated and highly integrated.

According to the invention, since the loading/unloading booth A, processing booth C and robot booth B are respectively installed in the system body which can be sealed, and the respective booths are partitioned by partition wall search having a required minimum sectional area, the flow of air between the system body and the outside is restrained to a required minimum extent, so that the interior of the system body can be maintained in a high cleanliness atmosphere. (0012 copied)

As a result, it is possible to effectively prevent particles from being re-stuck onto wafers after a cleaning treatment, splash of cleaning solution and the like involved in applying a cleaning treatment to wafers, and adverse effects upon an operator caused by generations of dust from the wafers per se.

Since the respective booths are partitioned by partition walls each having a required minimum sectional area, corrosion resistance coating may be applied only to the processing booth C which is in a corrosion atmosphere, but it is not necessary to apply corrosion resistance coating to an entire wall surface of the system body. As a result, it is possible to reduce a fabricating cost of the system and each unit.

Since the system is of a sheet-type wet cleaning treatment for applying a cleaning treatment to wafers one by one, particles and the like are scarcely re-stuck to the wafers a precise treatment is applied to every wafer, a cleaning space in the substrate cleaning chamber is rendered small and a small quantity of cleaning solution is rendered small.

Further, since a cleaning treatment is applied to the wafers W, W . . . one by one by a plurality of cleaning solutions, namely, one chamber type for applying all cleaning treatments in one substrate cleaning chamber 10, the wafers are not carried in or out in the cleaning treatment step so that the wafers do not contact an atmosphere, and hence they are not susceptible to a metallic contamination or influence of ions and oxygen and the like, and the construction of each substrate cleaning chamber can be simplified and small sized.

Further, since the loading/unloading booth A and processing booth C are respectively installed back and forth at both sides of the system body 1, and the robot booth B is sandwiched between these booths, harmful gas or particles generated when cleaning treatment is effected in the processing booth C are not leaked into an operating space O outside the system body 1, thereby further effectively preventing adverse effects upon an operator.

Further, since the wafers W, W . . . which are stocked in the carry-in section Aa and carry-out section Ab of the loading/unloading booth A are aligned vertically in a horizontal state at a given alignment pitch, clean air flowing horizontally in the loading/unloading booth A is directed from the carry-out section Ab to carry-in section Aa, it is possible to effectively prevent particles and the like from being re-stuck onto each wafer W after cleaning treatment from each wafer W before cleaning treatment.

Likewise, since the transport robot 70 of the robot booth B is formed of a twin arm robot provided with a pair of hand sections wherein one hand section places thereon each wafer W before cleaning treatment and the other hand section places thereon each wafer W after cleaning treatment, it is possible to effectively prevent particles and the like from being re-stuck to each wafer W after cleaning treatment from each wafer W before cleaning treatment.

What is claimed is:

1. A substrate cleaning system comprising:

a system body capable of being sealed;

a loading/unloading booth comprising a substrate carry-in section in which a plurality of substrates are stocked and standby to be carried in before cleaning treatment is applied to them and a substrate carry-out section in which a plurality of substrates are stocked and standby to be carried out after cleaning treatment was applied to them;

a processing booth provided with at least one sheet-type substrate cleaning chamber in which a cleaning treatment can be applied to a plurality of substrates by a plurality of cleaning solutions; and a robot booth provided with a transport robot for transporting the substrates one by one between the processing booth and the loading/unloading booth;

wherein the respective booths are partitioned by partition walls;

the loading/unloading booth and the robot booth are respectively installed in the system body;

the robot booth is sandwiched between the loading/unloading booth and the processing booth;

the loading/unloading booth has openings which are openable to an operating space provided outside the system body; and the inner wall surface of the processing both has a corrosion resistance coating treatment thereon, and the other wall side of the processing booth has a vinyl chloride resin and oxidation resistance painting treatment thereon.

2. A substrate cleaning system comprising:

a system body capable of being sealed;

a loading/unloading booth comprising a substrate carry-in section in which a plurality of substrates are stocked and standby to be carried in before cleaning treatment is applied to them and a substrate carry-out section in which a plurality of substrates are stocked and standby to be carried out after cleaning treatment was applied to them;

a processing booth provided with at least one sheet-type substrate cleaning chamber in which a cleaning treatment can be applied to a plurality of substrates by a plurality of cleaning solutions; and a robot booth provided with transport robots for transporting the substrates one by one between the processing booth and the loading/unloading booth;

wherein the respective booths are partitioned by partition walls;

the transport robots in the robot booth are formed of a twin arm robot each provided with a pair of hand sections, movable vertically and horizontally;

one of the hand sections transports the substrate before they are subjected to a cleaning treatment while the other hand section transports the substrate after they are subjected to the cleaning treatment; and wherein each substrate holding section provided at the tip end of each hand section of the transport robot has a soft landing type supporter for transporting and supporting the lower surface of each substrate.

3. A substrate cleaning system comprising:

a system body capable of being sealed;

a loading/unloading booth comprising a substrate carry-in section in which a plurality of substrates are stocked and standby to be carried in before cleaning treatment is applied to them and a substrate carry-out section in which a plurality of substrates are stocked and standby to be carried out after cleaning treatment was applied to them;

a processing booth provided with at least one sheet-type substrate cleaning chamber in which a cleaning treatment can be applied to a plurality of substrates by a plurality of cleaning solutions; and a robot booth provided with a transport robot for transporting the substrates one by one between the processing booth and the loading/unloading booth;

wherein the respective booths are partitioned by partition walls; and wherein a sheet-type substrate cleaning chamber in the processing booth is provided with a plurality of circular processing baths which are aligned vertically, and comprises a chamber body which moves vertically, and a substrate rotating unit which is disposed concentrically with the chamber body at the center and rotates a piece of substrate horizontally while supporting it horizontally, and wherein the substrates supported by the substrate rotating unit and the circular processing baths are positioned when the chamber body moves up and down vertically.

4. The substrate cleaning system according to claim 3, wherein the chamber body is a sealed container provided with an openable substrate carry-in gate.

5. The substrate cleaning system according to claim 3, wherein the chamber body comprises a chemical supply section for supplying cleaning solution onto a substrate surface supported by the substrate rotating unit, an inert gas supply section for supplying inert gas so as to discharge and exchange cleaning solution, and a drain section provided in each processing bath so as to drain cleaning solution or inert gas in each processing bath.

* * * * *